United States Patent
Okumura et al.

(10) Patent No.: US 7,056,416 B2
(45) Date of Patent: Jun. 6, 2006

(54) ATMOSPHERIC PRESSURE PLASMA PROCESSING METHOD AND APPARATUS

(75) Inventors: Tomohiro Okumura, Kadoma (JP); Tadashi Kimura, Kobe (JP); Yoichiro Yashiro, Kadoma (JP); Kenichi Sato, Ikoma (JP); Mitsuo Saitoh, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 290 days.

(21) Appl. No.: 10/365,449

(22) Filed: Feb. 13, 2003

(65) Prior Publication Data

US 2004/0075396 A1  Apr. 22, 2004

(30) Foreign Application Priority Data

| Feb. 15, 2002 | (JP) | ......... 2002-038103 |
| Mar. 19, 2002 | (JP) | ......... 2002-076816 |
| Oct. 24, 2002 | (JP) | ......... 2002-309349 |

(51) Int. Cl.
*C23F 1/02* (2006.01)
*C23C 14/00* (2006.01)
*C23C 16/00* (2006.01)

(52) U.S. Cl. .......... 156/345.37; 156/345.48; 204/298.36; 204/298.09; 118/723 R

(58) Field of Classification Search ............ 156/345.37, 156/345.48, 345.49, 345.53; 204/298.36, 204/298.09, 192; 118/723 R, 723 VE, 723; 315/111.21, 111.41, 111
See application file for complete search history.

(56) References Cited

U.S. PATENT DOCUMENTS

| 5,019,117 A | * | 5/1991 | Nakamura et al. ... 118/723 MR |
| 5,182,495 A | * | 1/1993 | Fukuda et al. .......... 315/111.41 |
| 5,211,825 A | * | 5/1993 | Saito et al. ............. 204/192.32 |
| 5,234,526 A | * | 8/1993 | Chen et al. ............. 156/345.42 |
| 5,336,355 A |   | 8/1994 | Zarowin et al. ............ 156/365 |

FOREIGN PATENT DOCUMENTS

| JP | 9-27482 | 1/1997 |
| JP | 2000-164395 | 6/2000 |
| KR | 0115496 | 1/1997 |

* cited by examiner

*Primary Examiner*—Tuyet Thi Vo
(74) *Attorney, Agent, or Firm*—Wenderoth, Lind & ponack, L.L.P.

(57) ABSTRACT

Provided is a plasma processing method for generating microplasma in a space of a microplasma source arranged in the vicinity of an object to be processed by supplying gas to the space and supplying electric power to a member located in the vicinity of the space, making activated particles emitted from an opening of the microplasma source joined to the space act on the object, and forming a fine linear portion on the object. The fine linear portion is formed on the object while flowing the gas to the neighborhood of the opening along the lengthwise direction of the fine linear portion parallel to the object.

15 Claims, 22 Drawing Sheets

Fig.22
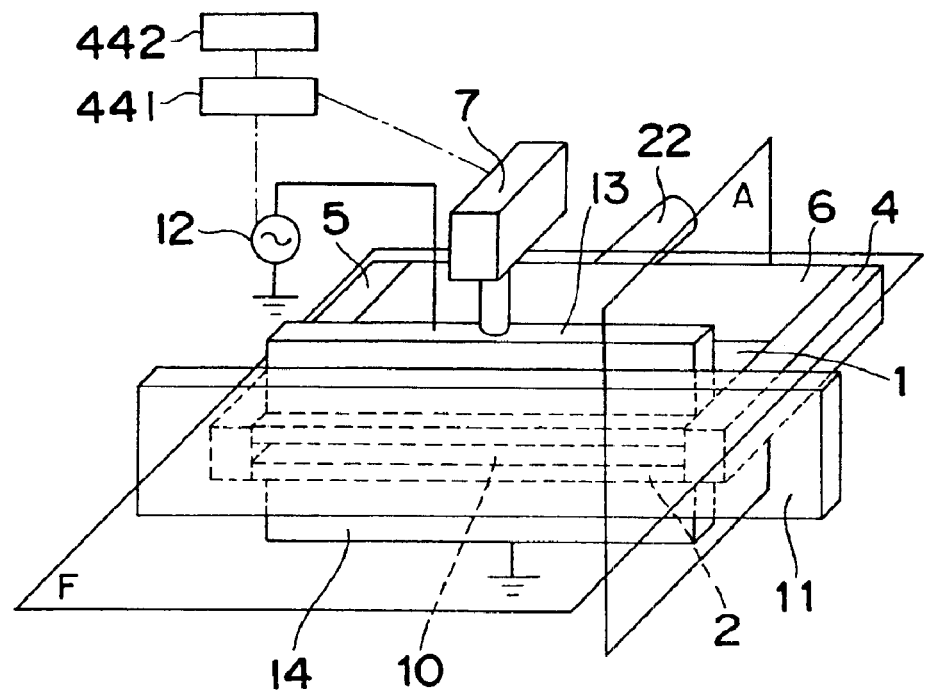
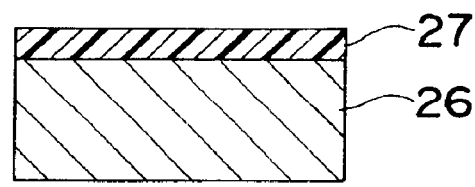
Fig.23A
PRIOR ART
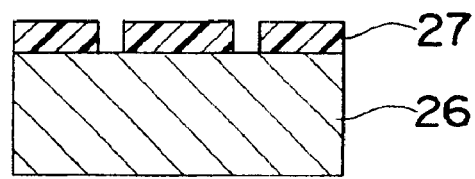
Fig.23B
PRIOR ART
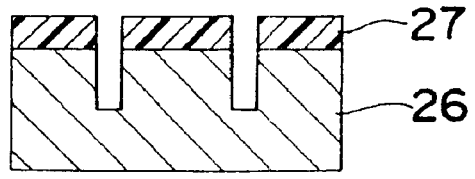
Fig.23C
PRIOR ART
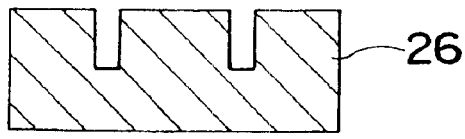
Fig.23D
PRIOR ART

ATMOSPHERIC PRESSURE PLASMA PROCESSING METHOD AND APPARATUS

BACKGROUND OF THE INVENTION

The present invention relates to a plasma processing method and apparatus, particularly to a plasma processing method and apparatus using a microplasma source, and more particularly to a plasma processing apparatus and method to be applied to the manufacturing processes of electronic devices such as semiconductors and MEMS (Micro Electromechanical Systems).

In general, a resist process is used when an object to be processed represented by a substrate on the surface of which a thin film is formed is subjected to a patterning process. FIGS. 23A through 23D show examples thereof. Referring to FIGS. 23A through 23D, first of all, a photoresist 27 is coated on the surface of an object 26 to be processed (see FIG. 23A). Next, if the photoresist 27 is exposed to light by means of an exposure apparatus and thereafter developed, then either of the exposed portion or the non-exposed portion of the photoresist 27 is removed, allowing the photoresist 27 to be patterned into the desired shape (see FIG. 23B). Subsequently, if the object 26 is placed in a vacuum vessel and plasma is generated inside the vacuum vessel to subject the object 26 to an etching process with the resist 27 used as a mask, then the surface of the object 26 is patterned into the desired shape (see FIG. 23C). Finally, by removing the resist 27 with oxygen plasma, an organic solvent, or the like, the processing is completed (see FIG. 23D).

The above-mentioned resist process, which has been appropriate for accurately forming a fine pattern, has therefore come to play an important role in manufacturing electronic devices such as semiconductors. However, there is a defect that the process is complicated.

Accordingly, there is currently being examined a new processing method that uses no resist process. As one example thereof, FIGS. 24–25 show perspective views of a processing apparatus provided with a microplasma source employed in a prior art example. FIG. 25 shows a sectional view cut in the plane A of FIG. 24. Referring to FIGS. 24 and 25, a space 73 (dot-hatching portion of FIG. 25, hereinafter referred to as a plasma space 73) for generating microplasma is formed between two ceramic plates 71 and 72. Side portions of the ceramic plates 71 and 72 are bonded to ceramic bars 74, 75, and 76. Gas is supplied from a gas supply unit 77 to the plasma space 73 via a pipe 78 and the ceramic bar 76. A through hole that serves as a gas supply inlet is provided at the ceramic bar 76 and joined to the pipe 78. By arranging an opening 80 of the microplasma source in the vicinity of a substrate 81 that serves as an object to be processed, supplying high-frequency power of 13.56 MHz from a high-frequency power supply 82 to a high-frequency electrode 83 while supplying gas to the plasma space 73 and grounding a grounding electrode 84, plasma is generated in the plasma space 73 to make activated particles emitted from the opening 80 of the microplasma source act on the substrate 81, allowing a fine linear portion 85 to be processed on the surface of the substrate 81. It is to be noted that the high-frequency electrode 83 and the grounding electrode 84 are parallel plate electrodes provided with interposition of the plasma space 73. The width B of the opening 80 of the microplasma source is 1 mm, and the distance C between the opening 80 of the microplasma source and the substrate 81 is 0.1 mm.

For example, on the condition that He is supplied by 2000 sccm and $CF_4$ is supplied by 4 sccm as gas and high-frequency power of 30 W is supplied, a molybdenum thin film formed on the substrate 81 can be subjected to an etching process.

However, in the processing described in connection with the prior art example, the active species dissociated by the plasma effuse along the surface of the substrate 81 as indicated by arrows in FIG. 25, and this has therefore led to an issue that the processing has been disadvantageously effected beyond the desired fine linear portion. FIG. 26 shows the obtained etching profile. In this case, on the assumption that the depth of the portion most deeply etched was D and the width of the portion shallower by D×0.8 than the bottom of the pattern was a processing width E, then E was 3.1 mm. Since the width B of the opening 10 of the microplasma source was 1 mm, then the processing width E disadvantageously became three or more times the width.

The present invention is accomplished in view of the aforementioned conventional issues and has the object of providing a plasma processing method and apparatus for accurately forming the desired fine linear portion by plasma processing.

SUMMARY OF THE INVENTION

In order to achieve the aforementioned object, the present invention is constructed as follows.

According to the first aspect of the present invention, there is provided a plasma processing method for forming a fine linear portion on an object to be processed by generating microplasma in a space of a microplasma source arranged in a vicinity of the object to be processed while supplying gas to the space of the microplasma source and supplying electric power to a member located in the vicinity of the space of the microplasma and by making activated particles discharged from an opening of the microplasma source connected to the space act on the object to be processed, the method comprising:

forming the fine linear portion on the object to be processed while flowing the gas to a neighborhood of the opening, parallel to the object to be processed, along a lengthwise direction of the fine linear portion.

According to the second aspect of the present invention, there is provided the plasma processing method of the first aspect, wherein the member located in the vicinity of the space of the microplasma source for supplying electric power is at least one of an electrode provided on a side opposite from a surface to be processed of the object to be processed, the object to be processed, and the microplasma source.

According to the third aspect of the present invention, there is provided the plasma processing method of the first or second aspect, wherein the space of the microplasma source has a gas supply inlet to which the gas is supplied and a gas exhaust outlet which is provided separately from the opening of the microplasma source and from which the gas supplied to the space is exhausted.

According to the fourth aspect of the present invention, there is provided the plasma processing method of any one of the first through third aspects, wherein the fine linear portion is formed on the object to be processed while flowing the gas to the neighborhood of the opening parallel to the object to be processed along the lengthwise direction of the fine linear portion in a state in which a cross-sectional area obtained by cutting the space for generating the microplasma by a plane perpendicular to the lengthwise direction of the fine linear portion is larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

Furthermore, according to the fifth aspect of the present invention, there is provided the plasma processing method of any one of the first through third aspects, wherein the fine linear portion is formed on the object to be processed while flowing the gas to the neighborhood of the opening parallel to the object to be processed along the lengthwise direction of the fine linear portion in a state in which a cross-sectional area obtained by cutting the space for generating the microplasma by a plane perpendicular to the lengthwise direction of the fine linear portion is ten or more times larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

According to the sixth aspect of the present invention, there is provided the plasma processing method of any one of the third through fifth aspects, wherein the fine linear portion is formed on the object to be processed while the gas supplied from the gas supply inlet is exhausted by 70% or more in terms of a supply flow rate from the gas exhaust outlet.

According to the seventh aspect of the present invention, there is provided the plasma processing method of any one of the first through sixth aspects, wherein the fine linear portion is formed on the object to be processed while flowing the gas through a gas flow passage provided parallel to the object to be processed along the lengthwise direction of the fine linear portion and discharging the activated particles from the opening narrower than the gas flow passage.

According to the eighth aspect of the present invention, there is provided the plasma processing method of the seventh aspect, wherein the fine linear portion is formed on the object to be processed while flowing the gas through a gas flow passage provided parallel to the object to be processed along the lengthwise direction of the fine linear portion and carrying out gas supply to the gas flow passage and gas exhaustion from the gas flow passage in a space separated from a space brought in contact with the object to be processed.

According to the ninth aspect of the present invention, there is provided the plasma processing method of any one of the seventh through eighth aspects, wherein the fine linear portion is formed on the object to be processed while flowing the gas to the neighborhood of the opening parallel to the object to be processed along the lengthwise direction of the fine linear portion in a space where a cross-sectional area obtained by cutting the gas flow passage by a plane perpendicular to the lengthwise direction of the fine linear portion is larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

Furthermore, according to the tenth aspect of the present invention, there is provided the plasma processing method of any one of the seventh through eighth aspects, wherein the fine linear portion is formed on the object to be processed while flowing the gas to the neighborhood of the opening parallel to the object to be processed along the lengthwise direction of the fine linear portion in a space where a cross-sectional area obtained by cutting the gas flow passage by a plane perpendicular to the lengthwise direction of the fine linear portion is ten or more times larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

According to the eleventh aspect of the present invention, there is provided a plasma processing method for forming a fine linear portion on an object to be processed by generating microplasma in a space of a microplasma source arranged in a vicinity of the object to be processed while supplying gas to the microplasma source and supplying electric power to at least one of an electrode provided on a side opposite from a surface to be processed of the object to be processed, the object to be processed, and the microplasma source and by making activated particles discharged from an opening of the microplasma source connected to the space act on the object to be processed, the method comprising:

forming the fine linear portion on the object to be processed while flowing the gas to a neighborhood of the opening parallel to the object to be processed along a lengthwise direction of the fine linear portion by carrying out gas supply to the space for generating the microplasma via a through hole provided at a wall surface that surrounds the space for generating the microplasma and carrying out gas exhaustion from the space for generating the microplasma via the space for generating the microplasma toward a side opposite from a side on which the fine linear portion of the object to be processed is disposed.

Preferably, the above-mentioned plasma processing methods are effective particularly when the processing is the processing of etching the fine linear portion of the object to be processed.

Preferably, in the plasma processing methods, it is acceptable to supply high-frequency power across parallel plate electrodes provided so as to place the space for generating the microplasma between them or supply pulse power across the parallel plate electrodes provided so as to place the space for generating microplasma between them.

Otherwise, it is acceptable to supply high-frequency power across an electrode located opposite from the object to be processed via the space for generating the microplasma and an electrode provided on the side opposite from the object to be processed or the surface to be processed of the object to be processed or to supply pulse power between the electrode located opposite from the object to be processed via the space for generating the microplasma and the electrode provided on the side opposite from the object to be processed or the surface to be processed of the object to be processed.

According to the twelfth aspect of the present invention, the opening of the microplasma source preferably has a width of not smaller than 0.01 mm and not greater than 5 mm.

Furthermore, according to the thirteenth aspect of the present invention, the opening of the microplasma source more preferably has a width of not smaller than 0.01 mm and not greater than 1 mm.

Moreover, according to the fourteenth aspect of the present invention, a distance between the opening of the microplasma source and the object to be processed preferably is not smaller than 0.01 mm and not greater than 1 mm.

Furthermore, according to the fifteenth aspect of the present invention, the distance between the opening of the microplasma source and the object to be processed more preferably is not smaller than 0.01 mm and not greater than 0.5 mm.

Furthermore, according to the above-mentioned plasma processing methods, it is preferable to carry out gas supply through a gas flow passage provided inside the parallel plate electrodes.

According to the sixteenth aspect of the present invention, there is provided a plasma processing apparatus comprising:

a microplasma source arranged in a vicinity of an object to be processed;

a gas supply unit for supplying plasma generating-use gas to a space of the microplasma source; and a power supply for supplying electric power to a member located in a vicinity of the space of the microplasma source, the space of the microplasma source communicating with a gas supply inlet to which the gas is supplied and a gas exhaust outlet which is provided separately from an opening of the microplasma source opposite to the object to be processed and from which the gas supplied to the space is exhausted, and the fine linear portion being formed on the object to be processed by generating microplasma in the space of the microplasma source while flowing the gas parallel to the object to be processed, along a lengthwise direction of the fine linear portion to be formed on the object to be processed, in the vicinity of the opening, from the gas supply inlet toward the gas exhaust outlet in the space of the microplasma source and by making activated particles discharged from the opening of the microplasma source communicating with the space act on the object to be processed.

According to the seventeenth aspect of the present invention, there is provided the plasma processing method of the sixteenth aspect, wherein the member located in the vicinity of the space of the microplasma source for supplying the electric power is at least one of an electrode provided on a side opposite from a surface to be processed of the object to be processed, the object to be processed, and the microplasma source.

According to the eighteenth aspect of the present invention, there is provided the plasma processing apparatus of the sixteenth or seventeenth aspect, wherein a cross-sectional area obtained by cutting the space for generating the microplasma by a plane perpendicular to the lengthwise direction of the fine linear portion is larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

Furthermore, according to the nineteenth aspect of the present invention, there is provided a plasma processing apparatus of the sixteenth or seventeenth aspect, wherein a cross-sectional area obtained by cutting the space for generating the microplasma by a plane perpendicular to the lengthwise direction of the fine linear portion is ten or more times larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

According to the twentieth aspect of the present invention, there is provided a plasma processing apparatus comprising:

a microplasma source arranged in a vicinity of an object to be processed;

a gas supply unit for supplying plasma generating-use gas to a microplasma generating-use space of the microplasma source; and a power supply for supplying electric power to a member located in a vicinity of the space of the microplasma source, the microplasma generating-use space of the microplasma source comprising a gas flow passage space separately from an opening of the microplasma source, the gas flow passage space communicating with a gas supply inlet to which the gas is supplied and a gas exhaust outlet which is provided separately from the opening of the microplasma source opposite to the object to be processed and from which the gas supplied to the gas flow passage space is exhausted, and the fine linear portion being formed on the object to be processed by generating microplasma in the microplasma generating-use space of the microplasma source while flowing the gas parallel to the object to be processed, along a lengthwise direction of the fine linear portion to be formed on the object to be processed, in the vicinity of the opening, from the gas supply inlet toward the gas exhaust outlet in the gas flow passage space of the microplasma source and by making activated particles discharged from the opening of the microplasma source communicating with the space act on the object to be processed.

According to the twenty-first aspect of the present invention, there is provided the plasma processing apparatus of the twentieth aspect, wherein the member located in the vicinity of the space of the microplasma source for supplying the electric power is at least one of an electrode provided on a side opposite from a surface to be processed of the object to be processed, the object to be processed, and the microplasma source.

According to the twenty-second aspect of the present invention, there is provided the plasma processing apparatus of the twentieth or twenty-first aspect, wherein the gas flow passage space communicating with the gas supply inlet for carrying out the gas supply and the gas exhaust outlet for carrying out the gas exhaustion is arranged separately from the microplasma generating-use space located adjacent to the object to be processed.

According to the twenty-third aspect of the present invention, there is provided the plasma processing apparatus of any one of the twentieth through twenty-second aspects, wherein a cross-sectional area obtained by cutting the gas flow passage space by a plane perpendicular to the lengthwise direction of the fine linear portion is larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

According to the twenty-fourth aspect of the present invention, there is provided the plasma processing apparatus of any one of the twentieth through twenty-second aspects, wherein a cross-sectional area obtained by cutting the gas flow passage space by a plane perpendicular to the lengthwise direction of the fine linear portion is ten or more times larger than a cross-sectional area obtained by cutting a rectangular parallelepiped that has the opening of the microplasma source and the fine linear portion of the object to be processed as opposite surfaces by a plane perpendicular to the lengthwise direction of the fine linear portion.

According to the twenty-fifth aspect of the present invention, there is provided the plasma processing apparatus of any one of the sixteenth through twenty-fourth aspects, wherein the gas supply to the space for generating the microplasma by the gas supply unit is carried out via a through hole provided at a wall surface that surrounds the space for generating the microplasma, and the gas exhaustion from the space for generating the microplasma is carried out via the space for generating the microplasma in a direction opposite from the opening of the microplasma source.

The above-mentioned plasma processing apparatuses are particularly preferable when the processing is the processing of etching the fine linear portion of the object to be processed.

In the above-mentioned plasma processing apparatuses, it is acceptable to supply high-frequency power across the parallel plate electrodes provided so as to place the space for generating the microplasma between them or supply pulse power across the parallel plate electrodes provided so as to place the space for generating microplasma between them.

Otherwise, it is acceptable to supply high-frequency power across an electrode located opposite from the object to be processed via a space for generating the microplasma and an electrode provided on the side opposite from the object to be processed or the surface to be processed of the object to be processed or to supply pulse power between the electrode located opposite from the object to be processed via the space for generating the microplasma and the electrode provided on the side opposite from the object to be processed or the surface to be processed of the object to be processed.

According to the twenty-sixth aspect of the present invention, there is provided the plasma processing apparatus of any one of the sixteenth through twenty-fifth aspects, wherein the opening of the microplasma source has a width of not smaller than 0.01 mm and not greater than 5 mm.

According to the twenty-seventh aspect of the present invention, there is provided the plasma processing apparatus of any one of the sixteenth through twenty-fifth aspects, wherein the opening of the microplasma source has a width of not smaller than 0.01 mm and not greater than 1 mm.

According to the twenty-eighth aspect of the present invention, there is provided the plasma processing apparatus of any one of the sixteenth through twenty-seventh aspects, wherein the distance between the opening of the microplasma source and the object to be processed is not smaller than 0.01 mm and not greater than 1 mm.

According to the twenty-ninth aspect of the present invention, there is provided the plasma processing apparatus of any one of the sixteenth through twenty-seventh aspects, wherein the distance between the opening of the microplasma source and the object to be processed is not smaller than 0.01 mm and not greater than 0.5 mm.

According to the thirtieth aspect of the present invention, there is provided a plasma processing apparatus comprising:

a high-frequency power supply for applying high-frequency power;

a plasma generating section provided with a first electrode connected to the high-frequency power supply, a second electrode arranged opposite from the first electrode and a discharge space for generating plasma discharge between the first electrode and the second electrode;

a gas supply unit for supplying gas to the discharge space;

a control unit for executing control so that a pressure of the discharge space is 100 Pa to 200 kPa and a product PD of the pressure P of the discharge space and a thickness D of the discharge space becomes 0.1 to 120 (Pa·m); and a moving unit for moving the plasma generating section and the object to be processed relatively to each other.

According to the thirty-first aspect of the present invention, there is provided the plasma processing apparatus of the thirtieth aspect, wherein the moving unit is a plasma generating section moving unit for moving the plasma generating section with respect to the object to be processed.

According to the thirty-second aspect of the present invention, there is provided the plasma processing apparatus of the thirtieth aspect, wherein the moving unit is an object moving unit for moving the object to be processed with respect to the plasma generating section.

According to the thirty-third aspect of the present invention, there is provided a plasma processing method comprising:

supplying gas to a discharge space formed between both first and second electrodes arranged oppositely to each other;

generating plasma in the discharge space by executing control so that a pressure of the discharge space is maintained at 100 Pa to 200 kPa and a product PD of the pressure P of the discharge space and a thickness D of the discharge space becomes 0.1 to 120 (Pa·m) and applying high-frequency power to the first electrode; and moving the generated plasma and the object to be processed relatively to each other to process the object to be processed by the generated plasma.

According to the thirty-fourth aspect of the present invention, there is provided the plasma processing apparatus of any one of the sixteenth through twenty-ninth aspects, further comprising:

a control unit for executing control so that a pressure of the space of the microplasma source is 100 Pa to 200 kPa and a product PD of the pressure P of the space of the microplasma source and a thickness D of the space of the microplasma source becomes 0.1 to 120 (Pa·m); and a moving unit for moving the space of the microplasma source and the object to be processed relatively to each other.

According to the thirty-fifth aspect of the present invention, there is provided the plasma processing method of any one of the first through fifteenth aspects, wherein, in forming the fine linear portion on the object, plasma is generated in the space of the microplasma source by executing control so that a pressure of the space of the microplasma source is maintained at 100 Pa to 200 kPa and a product PD of the pressure P of the space of the microplasma source and a thickness D of the space of the microplasma source becomes 0.1 to 120 (Pa·m) and supplying electric power to the member located in the vicinity of the space of the microplasma source, and the generated plasma and the object to be processed are moved relatively to each other to form the fine linear portion on the object to be processed by the generated plasma.

BRIEF DESCRIPTION OF THE DRAWINGS

These and other aspects and features of the present invention will become clear from the following description taken in conjunction with the preferred embodiments thereof with reference to the accompanying drawings, in which:

FIG. 22 is a perspective view showing the construction of a plasma processing apparatus employed in a seventh embodiment of the present invention;

FIGS. 23A, 23B, 23C, and 23D are views showing patterning processes used in a prior art example;

DETAILED DESCRIPTION OF THE EMBODIMENTS

Figure 1:
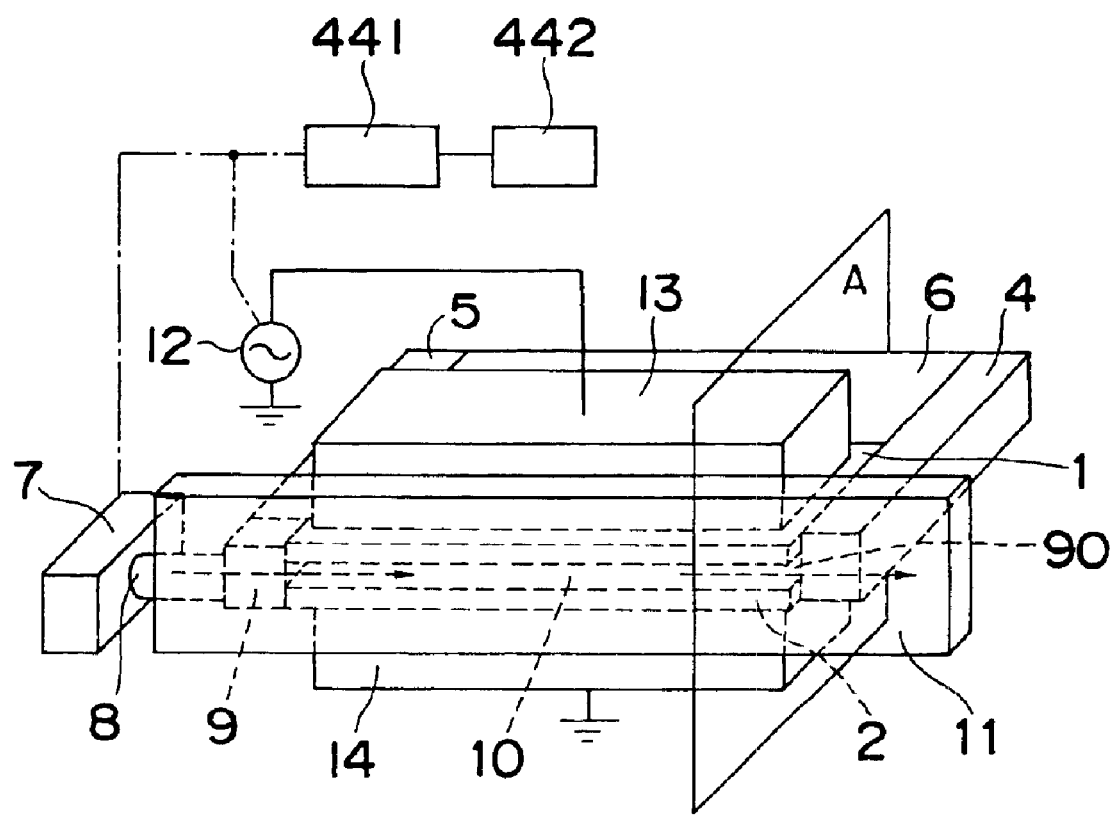
FIG. 1 is a perspective view showing the construction of a plasma processing apparatus employed in a first embodiment of the present invention.

Before the description of the present invention proceeds, it is to be noted that like parts are designated by like reference numerals throughout the accompanying drawings.

Embodiments of the present invention will be described in detail below with reference to the drawings.

A first embodiment of the present invention will be described below with reference to FIGS. 1 through 4.

Figure 2:
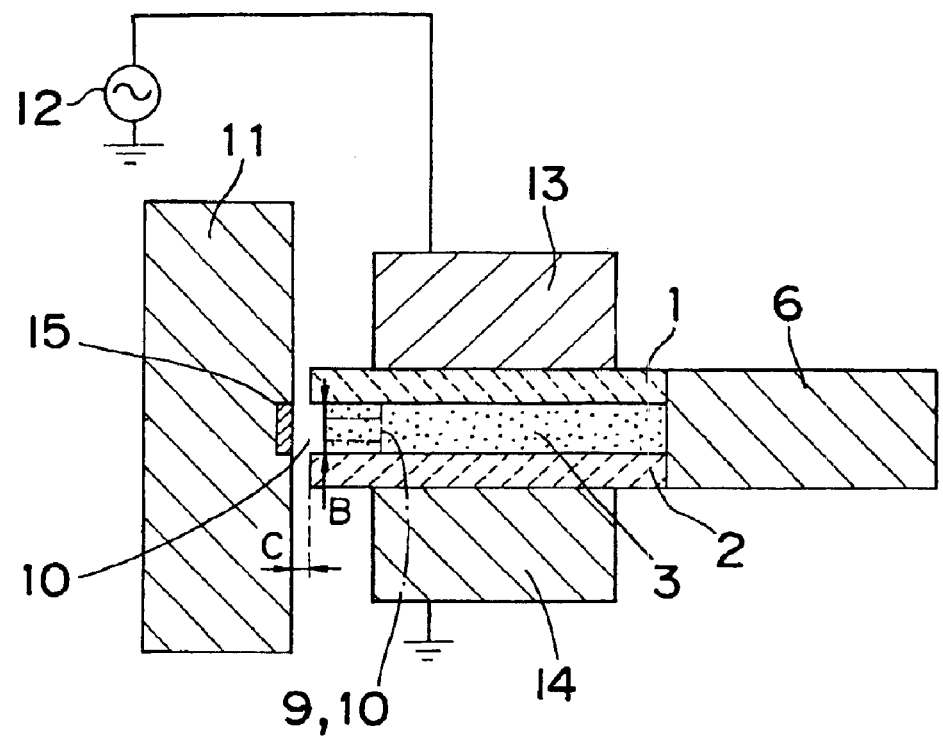
FIG. 2 is a sectional view showing the construction of the plasma processing apparatus employed in the first embodiment of the present invention.

FIG. 1 shows a perspective view of a plasma processing apparatus provided with a microplasma source employed in the first embodiment of the present invention. FIG. 2 shows a sectional view cut in the plane A of FIG. 1. Referring to FIGS. 1 and 2, a microplasma generating-use space 3 (dot-hatching portion in FIG. 2, hereinafter referred to as a plasma space 3) of a roughly rectangular parallelepiped configuration for generating microplasma is formed as a microplasma source between two ceramic dielectric plates (ceramic plates as one example) 1 and 2. Three side portions of the ceramic dielectric plates 1 and 2 are bonded to ceramic bar-shaped dielectric members (ceramic bars as one example) 4, 5 and 6, and a substrate 11, which serves as one example of the object to be processed, is oppositely disposed with interposition of a minute gap on the remaining one side portion, constituting a microplasma source. Gas is supplied from a gas supply unit 7 to the plasma space 3 via a pipe 8 and a gas-introducing section 9 (one example of the gas supply inlet) The gas-introducing section 9 is made of ceramic, provided with through holes that serve as gas supply inlets and joined to the pipe 8. On the other hand, a gas exhaust outlet 90 is formed at a side portion, which is located between the ceramic dielectric plates 1 and 2 and opposite from the gas-introducing section 9 that functions as one example of the gas supply inlet, without contact with the ceramic bar-shaped dielectric member 4. By arranging an elongate rectangular opening 10 of the microplasma source in the vicinity of the substrate 11 that serves as the object to be processed, supplying the gas into the plasma space 3 from the gas-introducing section 9 and exhausting the gas inside the plasma space 3 from the gas exhaust outlet 90, the gas flowed along the lengthwise direction of the opening 10 parallel to the substrate 11 in the vicinity of the opening 10. By supplying high-frequency power of 13.56 MHz from a high-frequency power supply 12 to a high-frequency electrode 13 that serves as one example of the member located in the vicinity of the space 3 of the microplasma source and grounding a grounding electrode 14, plasma is generated in the plasma space 3, and the activated particles discharged from the opening 10 of the microplasma source act on the substrate 11, allowing a fine linear portion 15 to be formed on the surface of the substrate 11. It is to be noted that the high-frequency electrode 13 and the grounding electrode 14 are parallel plate electrodes provided so as to place the plasma space 3 between them. Moreover, as one example, the width B of the opening 10 of the microplasma source is 1 mm, and the distance C between the opening 10 of the microplasma source and the substrate 11 is 0.1 mm.

A plasma processing control unit 441 is connected to a high-frequency power supply 12, a gas supply unit 7, and a memory 442, which stores various sorts of plasma processing information for the substrate 11, and executes application control of high-frequency power from the high-frequency power supply 12 to the electrode 13 and gas supply control with the gas supply unit 7 on the basis of the various sorts of plasma processing information stored in the memory 442. By this operation, appropriate plasma processing can be automatically carried out.

The microplasma source, which is operable at several pascals to several times the atmospheric pressure, typically operates within a range of a pressure of 10000 Pa to about triple the atmospheric pressure. In particular, the operation at or around the atmospheric pressure, which requires neither a strict sealing structure nor a special exhaust unit and appropriately restrains the diffusion of the plasma and the activated particles, is especially preferable.

Figure 3:
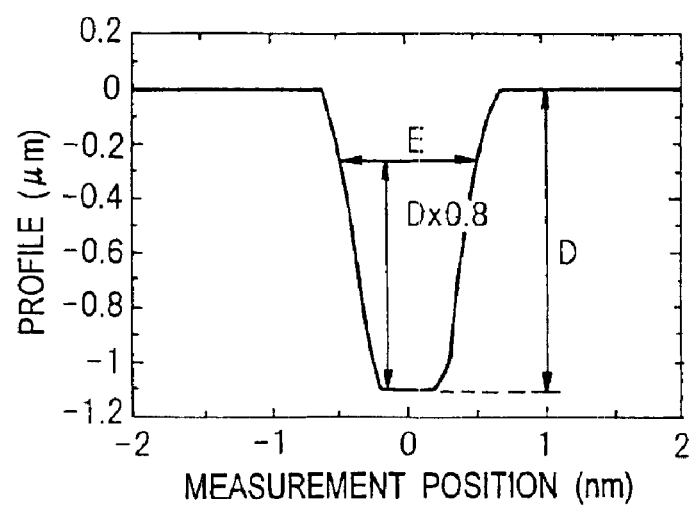
FIG. 3 is a graph showing an etching profile in the first embodiment of the present invention.

As one concrete example, a molybdenum thin film, which served as one example of the fine linear portion 15 formed on the substrate 11 on the condition that He was supplied by 2000 sccm and $CF_4$ was supplied by 4 sccm, as a gas, and high-frequency power of 30 W was supplied, was subjected to an etching process. Consequently, an etching profile as shown in FIG. 3 was obtained. In this case, on the assumption that the depth of the portion most deeply etched was D and the width of the portion shallower by D×0.8 than the bottom of the pattern was a processing width E, then E was 1.1 mm. Since the width B of the opening 10 of the microplasma source was 1 mm, the processing width E was only 10% larger than this, and the formation accuracy was remarkably improved in comparison with the prior art example.

The reason why the formation accuracy is improved as described above is presumably because the gas flows from the gas-introducing section 9 toward the gas exhaust outlet 90 parallel to the substrate 11 along the lengthwise direction of the fine linear portion 15 and in the vicinity of the opening 10, making it difficult for the activated particles generated by the plasma to come in contact with the substrate surface portion located outside the fine linear portion 15.

Figure 4:
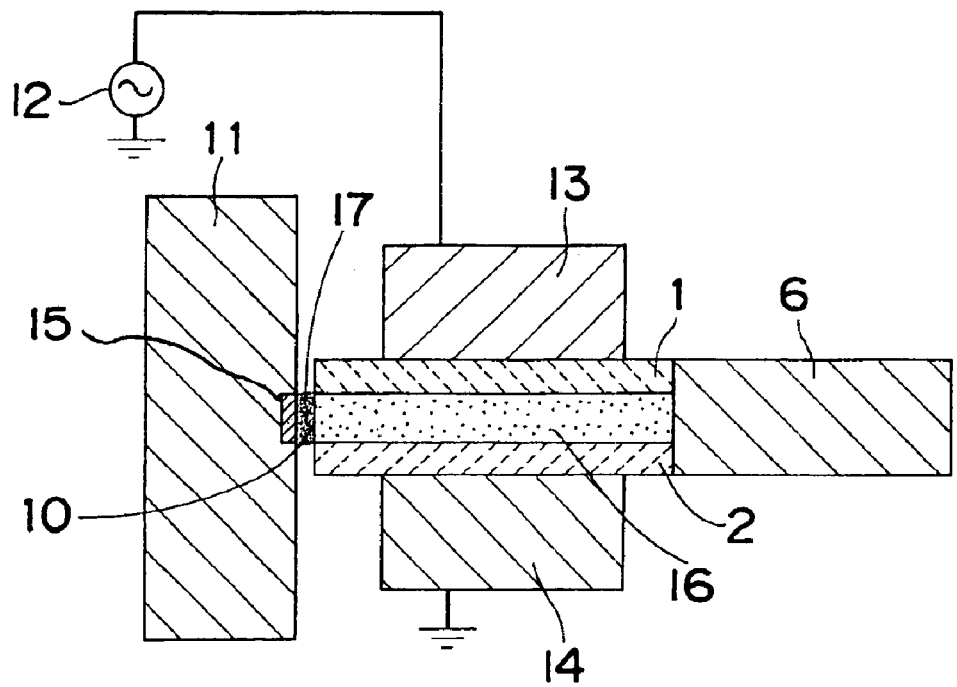
FIG. 4 is a sectional view showing the construction of the plasma processing apparatus employed in the first embodiment of the present invention.

In the first embodiment of the present invention, as shown in FIG. 4 as one example, a cross-sectional area 16 (dot-hatching portion in FIG. 4) of a cross section obtained by cutting the plasma space 3 by a plane perpendicular to the lengthwise direction of the fine linear portion 15 is twenty times as large as a cross-sectional area 17 (rectangular gray portion in FIG. 4) of a cross section obtained by cutting a rectangular parallelepiped, which has the opening 10 of the microplasma source and the fine linear portion 15 of the object as opposite surfaces, by a plane perpendicular to the lengthwise direction of the fine linear portion 15. In order to improve the formation accuracy, the cross-sectional area of the cross section obtained by cutting the plasma space by the plane perpendicular to the lengthwise direction of the fine linear portion is required to be larger than the cross-sectional area of the cross section obtained by cutting the rectangular parallelepiped, which has the opening of the microplasma source and the fine linear portion of the object as opposite surfaces, by the plane perpendicular to the lengthwise direction of the fine linear portion. However, in order to obtain higher formation accuracy, this ratio preferably is roughly ten or more times greater. If this ratio is smaller than 10 times, then the activated particles generated by plasma are discharged outwardly of the fine linear portion of the surface of the substrate, and the formation accuracy is degraded.

According to the plasma processing method of the first embodiment of the present invention, microplasma is generated inside the space 3 of the microplasma source by supplying electric power to the microplasma source that serves as one example of the member located in the vicinity of the space 3 of the microplasma source while supplying the gas into the space of the microplasma source arranged in the vicinity of the substrate 11, and the activated particles discharged from the opening 10 of the microplasma source joined to the space 3 are made to act on the substrate 11 to form the fine linear portion 15 on the surface of the substrate 11. Therefore, the fine linear portion can be formed on the object while flowing the gas parallel to the substrate 11 along the lengthwise direction of the fine linear portion 15 and in the vicinity of the opening 10, and the desired fine linear portion 15 can be accurately processed by plasma.

Furthermore, according to the plasma processing apparatus of the first embodiment of the present invention, there are provided the microplasma source arranged in the vicinity of the substrate 11, the gas supply unit 7 for supplying the plasma generating-use gas to the space 3 of the microplasma source, and the power supply 12 for supplying power to the member located in the vicinity of the space 3 of the microplasma source, e.g., the microplasma source. The space 3 of the microplasma source communicates with the gas supply inlet 9 to which the gas is supplied and the gas exhaust outlet 90, which is provided separately from the opening 10 of the microplasma source opposite to the substrate 11 and from which the gas supplied into the space 3 is exhausted. The microplasma is generated inside the space 3 of the microplasma source while flowing the gas parallel to the substrate 11 along the lengthwise direction of the fine linear portion 15 to be formed on the substrate 11 and in the vicinity of the opening 10 from the gas supply inlet 9 toward the gas exhaust outlet 90 in the space 3 of the microplasma source to make the activated particles discharged from the opening 10 of the microplasma source act on the substrate 11, thereby forming the fine linear portion 15 on the substrate 11. Therefore, the structure of flowing the gas parallel to the substrate 11 along the lengthwise direction of the fine linear portion 15 and in the vicinity of the opening 10 can be formed, and the desired fine linear portion 15 can be accurately processed by plasma.

A second embodiment of the present invention will be described next with reference to FIGS. 5 through 8.

Figure 5:
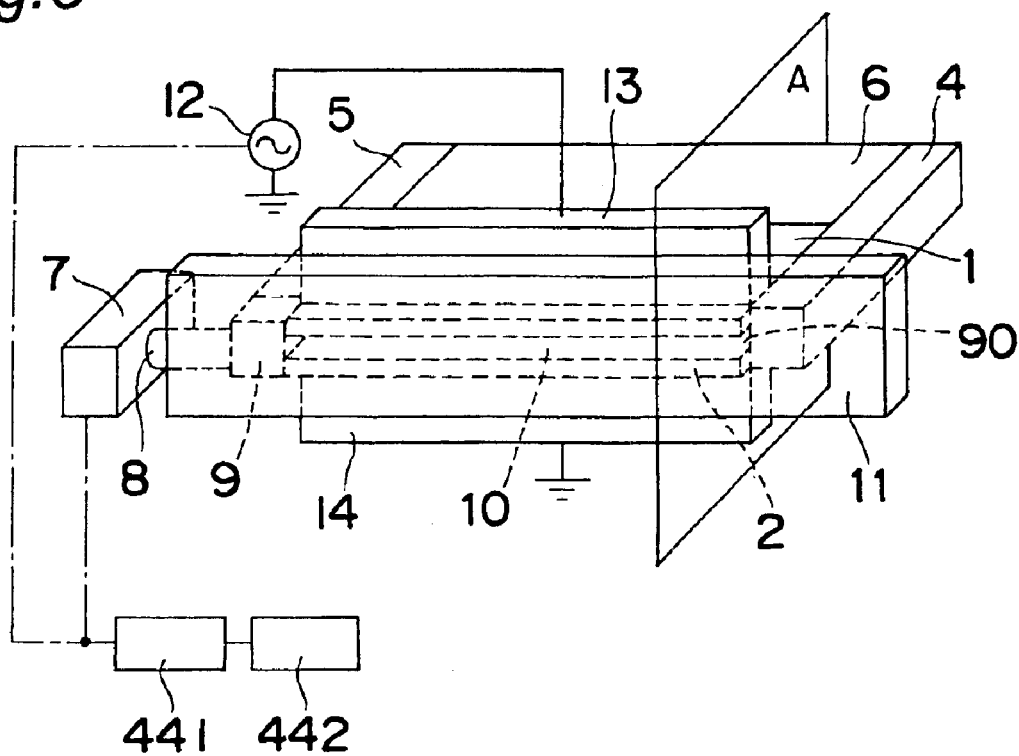
FIG. 5 is a perspective view showing the construction of a plasma processing apparatus employed in a second embodiment of the present invention.
Figure 6:
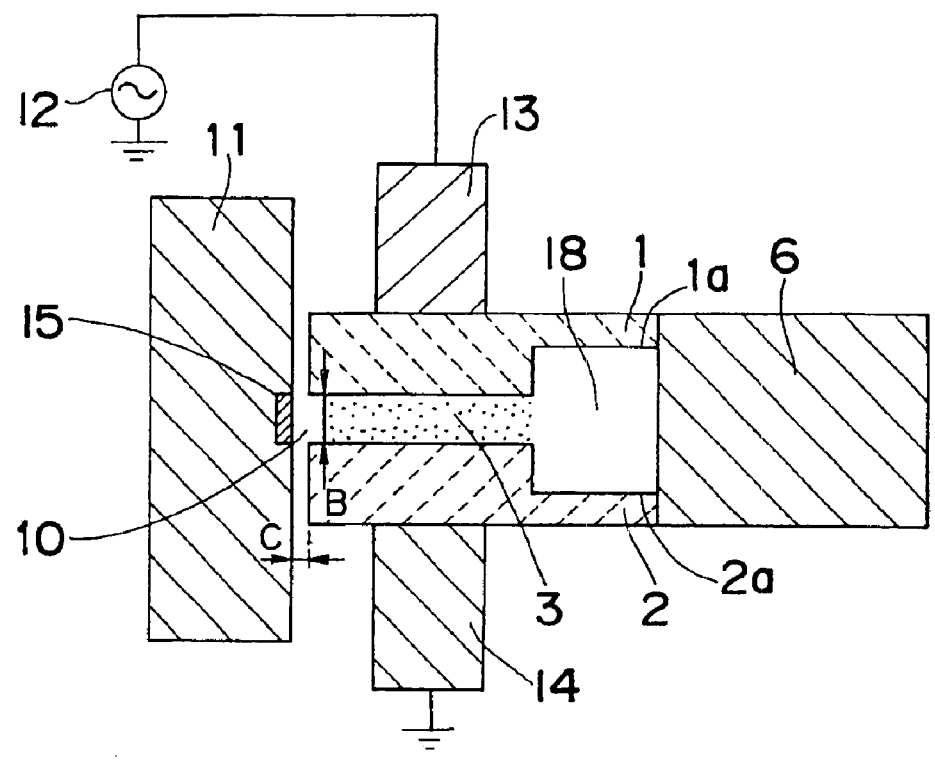
FIG. 6 is a sectional view showing the construction of the plasma processing apparatus employed in the second embodiment of the present invention.

FIG. 5 shows a perspective view of a plasma processing apparatus provided with a microplasma source employed in the second embodiment of the present invention. FIG. 6 shows a sectional view cut in the plane A of FIG. 5. Referring to FIGS. 5 and 6, a microplasma generating-use space 3 (dot-hatching portion in FIG. 6, hereinafter referred to as a plasma space 3) of a roughly rectangular parallelepiped shape for generating microplasma is formed between two ceramic dielectric plates 1 and 2. Three side portions of the ceramic dielectric plates 1 and 2 are bonded to ceramic bar-shaped dielectric members 4, 5, and 6, and a substrate 11, which serves as one example of the object to be processed (object), is oppositely disposed with interposition of a minute gap on the remaining one side portion. Gas is supplied from a gas supply unit 7 to a gas flow passage 18 constructed of a gas flow passage space provided parallel to the substrate 11 along the lengthwise direction of a fine linear portion 15 via a pipe 8 and a gas-introducing section 9 (one example of the gas supply inlet). The gas flow passage 18 is continuous to the plasma space 3 and is formed so that its spatial dimension in the direction of thickness of the ceramic dielectric plates 1 and 2 becomes larger than that of the plasma space 3 due to recess portions 1a and 2a similarly formed on the opposed surfaces of the ceramic dielectric plates 1 and 2 on the ceramic bar-shaped dielectric member 6 side. This is the point greatly different from the plasma processing apparatus of the first embodiment. The gas-introducing section 9 is made of ceramic, provided with a through hole that serves as a gas supply inlet and joined to the pipe 8. On the other hand, a gas exhaust outlet 90 is formed at a side portion, which is located between the ceramic dielectric plates 1 and 2 and opposite from the gas-introducing section 9 without contact with the ceramic bar-shaped dielectric member 4. By arranging an elongate rectangular opening 10 of the microplasma source in the vicinity of the substrate 11 that serves as the object, supplying the gas into the plasma space 3, and exhausting the gas inside the plasma space 3 from the gas exhaust outlet 90, the gas is flowed along the lengthwise direction of the opening 10 parallel to the substrate 11 and in the vicinity of the opening 10. By supplying high-frequency power of 13.56 MHz from a high-frequency power supply 12 to a high-frequency electrode 13 and grounding a grounding electrode 14, plasma is generated in the plasma space 3, and the activated particles discharged from the opening 10 of the microplasma source act on the substrate 11, allowing a fine linear portion 15 to be formed on the surface of the substrate 11. It is to be noted that the high-frequency electrode 13 and the grounding electrode 14 are parallel plate electrodes provided so as to place the plasma space 3 between them. Moreover, as one example, the width B of the opening 10 of the microplasma source is 1 mm, and the distance C between the opening 10 of the microplasma source and the substrate 11 is 0.1 mm.

The microplasma source, which is operable at several pascals to several times the atmospheric pressure, typically operates within a range of a pressure of 10000 Pa to about triple the atmospheric pressure. In particular, the operation at or around the atmospheric pressure, which requires neither a strict sealing structure nor a special exhaust unit and appropriately restrains the diffusion of the plasma and the activated particles, is especially preferable.

Figure 7:
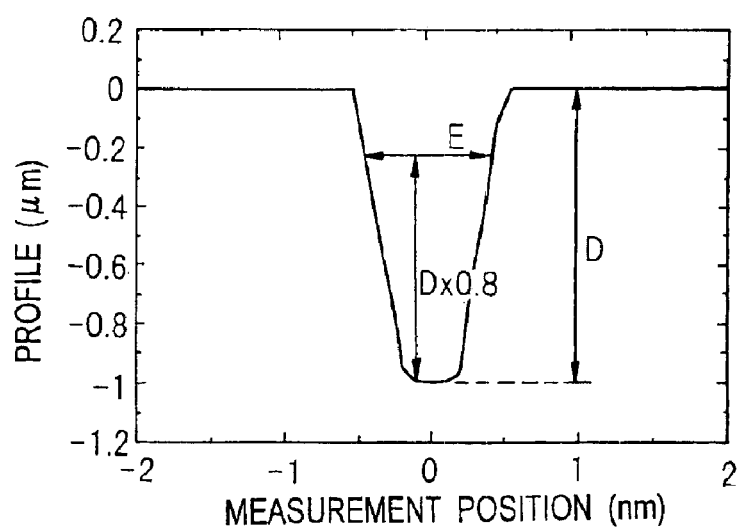
FIG. 7 is a graph showing an etching profile in the second embodiment of the present invention.

According to one concrete example, a molybdenum thin film, which served as one example of the fine linear portion 15 formed on the substrate 11 on the condition that He was supplied by 2000 sccm and $CF_4$ was supplied by 4 sccm, as a gas, and a high-frequency power of 30 W was supplied, was subjected to an etching process. Consequently, an etching profile as shown in FIG. 7 was obtained. In this case, on the assumption that the depth of the portion most deeply etched was D and the width of the portion shallower by D×0.8 than the bottom of the pattern was a processing width E, then E was 0.91 mm. Since the width B of the opening 10 of the microplasma source was 1 mm, the processing width E was smaller than this, and the formation accuracy was remarkably improved in comparison with the prior art example.

The reason why the formation accuracy is improved as described above is presumably because the gas flows through the gas flow passage 18 provided from the gas-introducing section 9 toward the gas exhaust outlet 90 parallel to the substrate 11 along the lengthwise direction of the fine linear portion 15 and the activated particles are discharged from the opening 10 which is narrower than the gas flow passage 18, making it difficult for the activated particles generated by the plasma to come in contact with the substrate surface portion located outside the fine linear portion 15.

Figure 8:
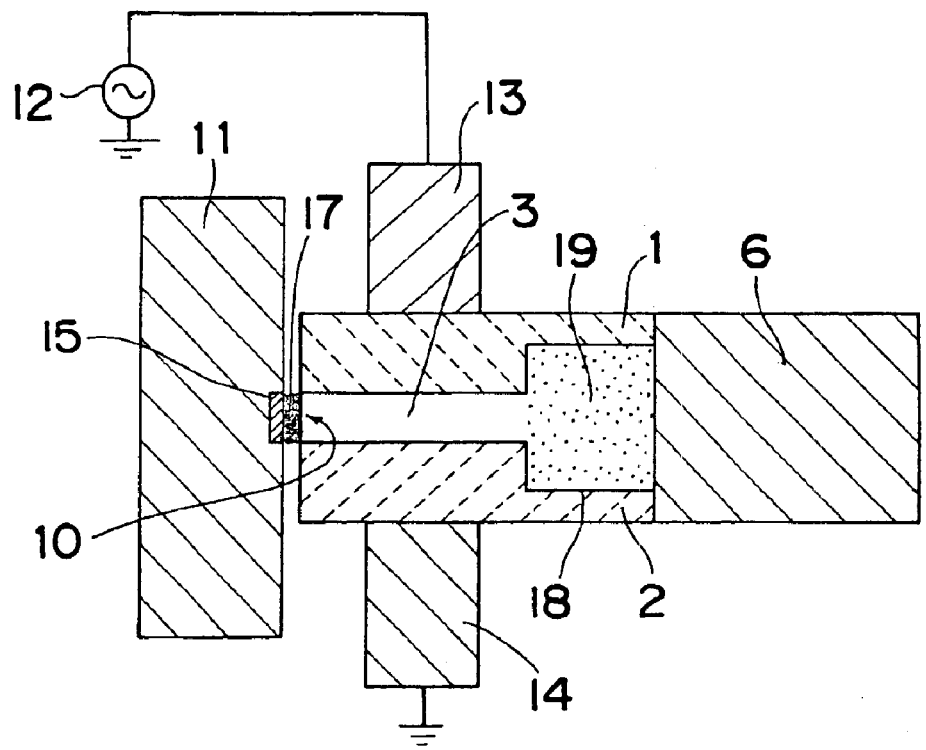
FIG. 8 is a sectional view showing the construction of the plasma processing apparatus employed in the second embodiment of the present invention.

In the second embodiment of the present invention, shown as one example in FIG. 8, a cross-sectional area 19 (dot-hatching portion in FIG. 8) of a cross section obtained by cutting the gas flow passage 18 by a plane perpendicular to the lengthwise direction of the fine linear portion 15 is twenty-four times as large as a cross-sectional area 17 (rectangular gray portion in FIG. 8) of a cross section obtained by cutting a rectangular parallelepiped, which has the opening 10 of the microplasma source and the fine linear portion 15 of the object as opposite surfaces, by a plane perpendicular to the lengthwise direction of the fine linear portion 15. In order to improve the formation accuracy, the cross-sectional area of the cross section obtained by cutting the gas flow passage by the plane perpendicular to the lengthwise direction of the fine linear portion is required to be larger than the cross-sectional area of the cross section obtained by cutting the rectangular parallelepiped, which has the opening of the microplasma source and the fine linear portion of the object as opposite surfaces, by the plane perpendicular to the lengthwise direction of the fine linear portion. However, in order to obtain higher formation accuracy, this ratio preferably is roughly ten or more times greater. If this ratio is smaller than 10 times, then the activated particles generated by plasma are discharged outwardly of the fine linear portion of the surface of the substrate, and the formation accuracy is degraded.

According to the plasma processing method of the second embodiment of the present invention, microplasma is generated inside the space 3 of the microplasma source by supplying electric power to the member located in the vicinity of the space 3 of the microplasma source, e.g., the microplasma source while supplying the gas into the space of the microplasma source arranged in the vicinity of the substrate 11, and the activated particles discharged from the opening 10 of the microplasma source joined to the space 3 act on the substrate 11 to form the fine linear portion 15 on the substrate 11. The gas is flowed through the gas flow passage provided parallel to the substrate 11 along the lengthwise direction of the fine linear portion 15, and the fine linear portion 15 is formed on the object with the activated particles discharged from the opening 10 narrower than the gas flow passage. Therefore, the desired fine linear portion 15 can be accurately processed by plasma.

Furthermore, according to the plasma processing apparatus of the second embodiment of the present invention, there are provided the microplasma source arranged in the vicinity of the substrate 11, the gas supply unit 7 for supplying the plasma generating-use gas to the microplasma generating-use space 3 of the microplasma source, and the power supply 12 for supplying electric power to the member located in the vicinity of the space 3 of the microplasma source, e.g., the microplasma source. The microplasma generating-use space 3 of the microplasma source is provided with the gas flow passage 18 separately from the opening 10 of the microplasma source, and this gas flow passage 18 communicates with the gas supply inlet 20 to which the gas is supplied and the gas exhaust outlet 21, which is provided separately from the opening 10 of the microplasma source located opposite to the substrate 11 and from which the gas supplied into the gas flow passage 18 is exhausted. While flowing the gas in the vicinity of the opening 10 parallel to the substrate 11 along the lengthwise direction of the fine linear portion 15 to be formed on the substrate 11 from the gas supply inlet 20 toward the gas exhaust outlet 21 inside the gas flow passage use space 3 of the microplasma source, microplasma is generated inside the microplasma generating-use space 3 of the microplasma source, making the activated particles discharged from the opening 10 of the microplasma source communicating with the plasma space 3 act on the substrate 11 and forming the fine linear portion 15 on the substrate 11. The gas flow passage is provided parallel to the substrate 11 along the lengthwise direction of the fine linear portion 15. Since the opening 10 is narrower than the gas flow passage, the desired fine linear portion 15 can be accurately processed by plasma.

A third embodiment of the present invention will be described next with reference to FIGS. 9 through 13.

Figure 9:
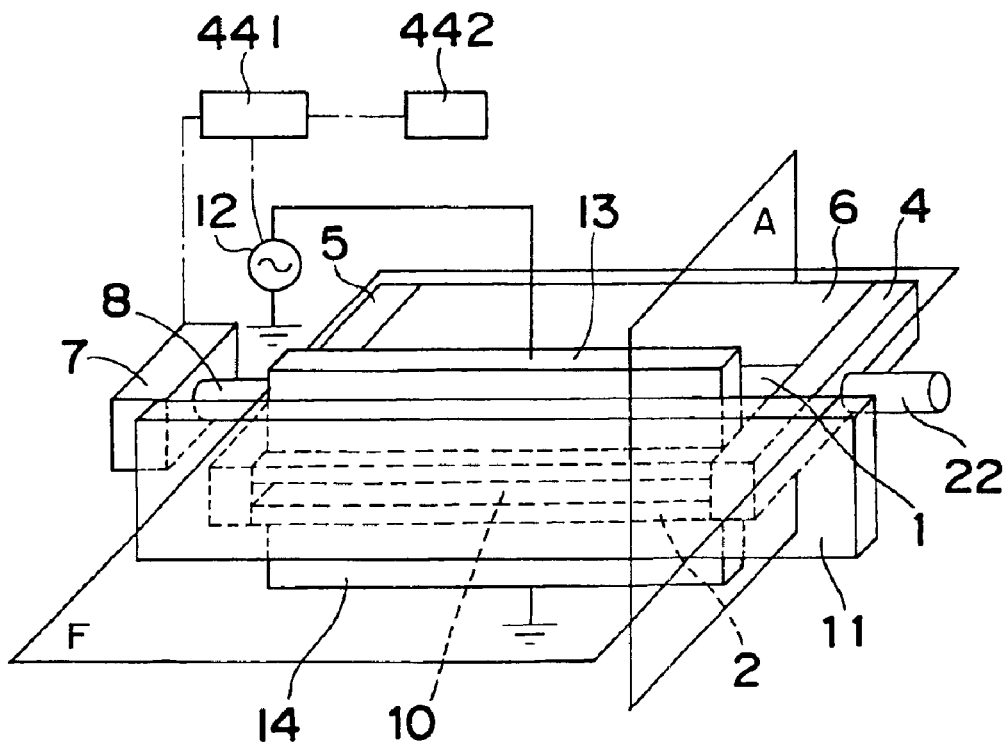
FIG. 9 is a perspective view showing the construction of a plasma processing apparatus employed in a third embodiment of the present invention.
Figure 10:
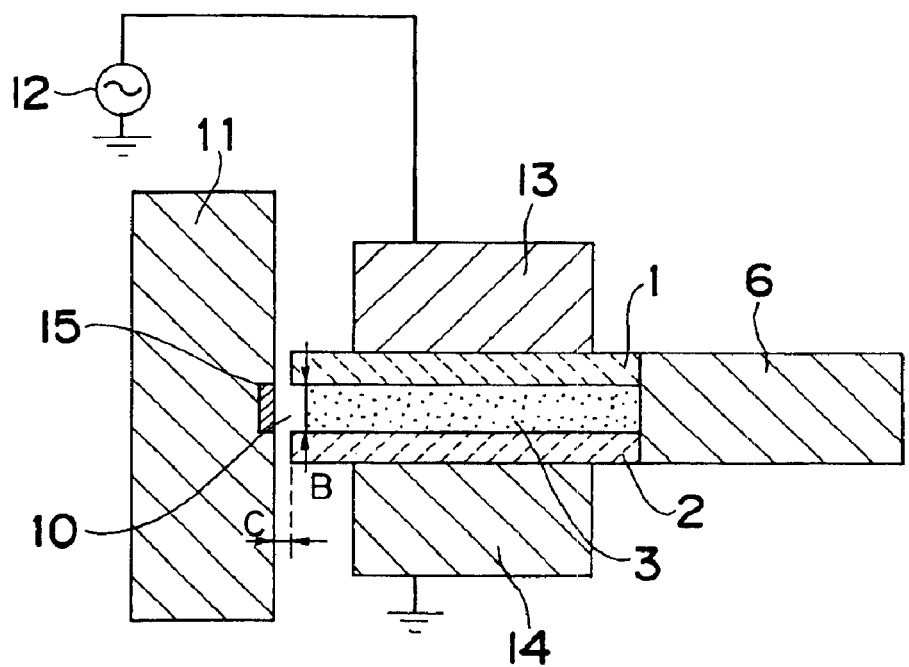
FIG. 10 is a sectional view showing the construction of the plasma processing apparatus employed in the third embodiment of the present invention.
Figure 11A:
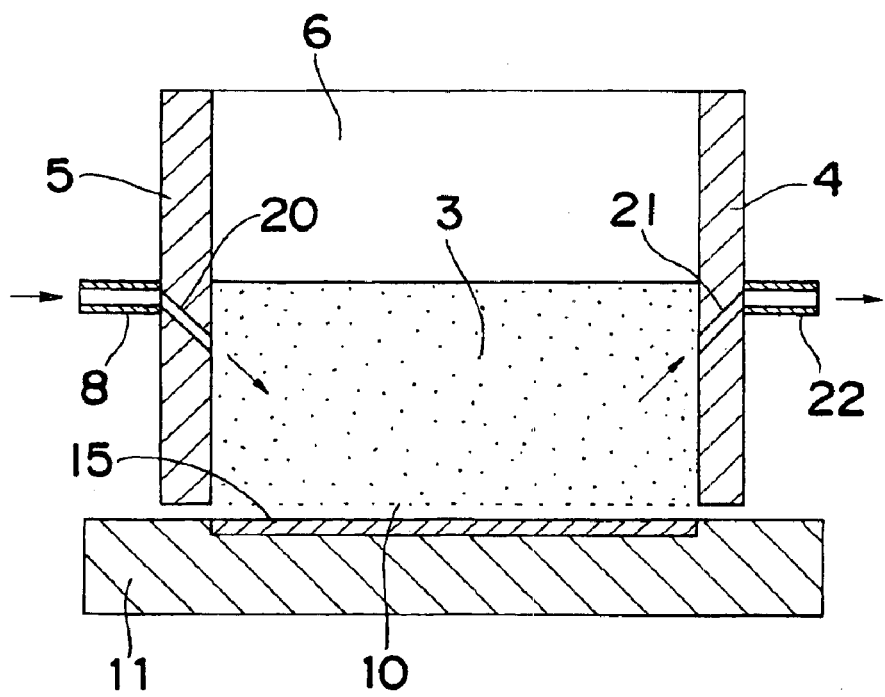
FIG. 11A and FIG. 11B are sectional views showing the construction of the plasma processing apparatus employed in the third embodiment of the present invention and the construction of a plasma processing apparatus employed in its modification example, respectively.

FIG. 9 shows a perspective view of a plasma processing apparatus provided with a microplasma source employed in the third embodiment of the present invention. FIG. 10 shows a sectional view cut in the plane A of FIG. 9. FIG. 11A shows a sectional view cut in the plane F of FIG. 9. Referring to FIGS. 9, 10, and 11A, a microplasma generating-use space 3 (dot-hatching portion in FIGS. 10 and 11A, hereinafter referred to as a plasma space 3) of a roughly rectangular parallelepiped configuration for generating microplasma is formed between two ceramic dielectric plates 1 and 2. Three side portions of the ceramic dielectric plates 1 and 2 are bonded to ceramic bar-shaped dielectric members 4, 5, and 6, and a substrate 11, which serves as one example of the object, is oppositely disposed with interposition of a minute gap on the remaining one side portion. Gas is supplied from a gas supply unit 7 to a gas flow passage provided parallel to the substrate 11 along the lengthwise direction of the fine linear portion 15 via a pipe 8 and a slant through hole 20 (one example of the gas supply inlet) which is formed in the ceramic bar-shaped dielectric member 5 and inclined toward the substrate 11. The gas is exhausted from the gas flow passage via a pipe 22 through a slant through hole 21 (one example of the gas exhaust outlet) which is formed in the ceramic bar-shaped dielectric member 4 and inclined toward the substrate 11. It is to be noted that the gas flow passage is roughly the same space as the plasma space 3. By disposing the elongated rectangular opening 10 of the microplasma source in the vicinity of the substrate 11 that serves as the object, supplying the gas into the plasma space 3 and exhausting the gas inside the plasma space 3 from the through hole 21 that functions as a gas exhaust outlet, the gas is flowed parallel to the substrate 11 along the lengthwise direction of the opening 10 and in the vicinity of the opening 10. By supplying high-frequency power of 13.56 MHz from a high-frequency power supply 12 to a high-frequency electrode 13 and grounding a grounding electrode 14, plasma is generated in the plasma space 3, and the activated particles discharged from the opening 10 of the microplasma source act on the substrate 11, allowing a fine linear portion 15 to be formed on the surface of the substrate 11. It is to be noted that the high-frequency electrode 13 and the grounding electrode 14 are parallel plate electrodes provided so as to place the plasma space 3 between them. Moreover, as one example, the width B of the opening 10 of the microplasma source is 1 mm, and the distance C between the opening 10 of the microplasma source and the substrate 11 is 0.1 mm.

The microplasma source, which is operable at several pascals to several times the atmospheric pressure, typically operates within a range of a pressure of 10000 Pa to about triple the atmospheric pressure. In particular, the operation at or around the atmospheric pressure, which requires neither a strict sealing structure nor a special exhaust system and appropriately restrains the diffusion of the plasma and the activated particles, is especially preferable.

Figure 12:
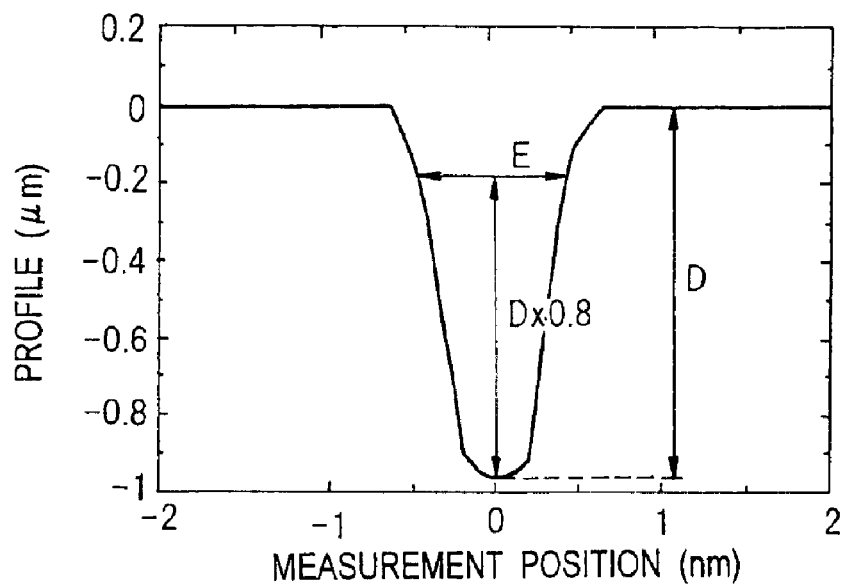
FIG. 12 is a graph showing an etching profile in the third embodiment of the present invention.

As one concrete example, a molybdenum thin film, which served as one example of the fine linear portion 15 formed on the substrate 11 on the condition that He was supplied by 2000 sccm and $CF_4$ was supplied by 4 sccm, as a gas, and high-frequency power of 30 W was supplied, was subjected to an etching process. Consequently, an etching profile as shown in FIG. 12 was obtained. In this case, on the assumption that the depth of the portion most deeply etched was D and the width of the portion shallower by D×0.8 than the bottom of the pattern was a processing width E, then E was 0.95 mm. Since the width B of the opening 10 of the microplasma source was 1 mm, the processing width E was smaller than this, and the formation accuracy was remarkably improved in comparison with the prior art example.

The reason why the formation accuracy is improved as described above is presumably because the gas is flowed through the gas flow passage provided parallel to the substrate 11 along the lengthwise direction of the fine linear portion 15 from the through hole 20 that functions as a gas supply inlet toward the through hole 21 that functions as a gas exhaust outlet, and the gas supply to the gas flow passage and the gas exhaustion from the gas flow passage are carried out in a space separated from the space brought in contact with the substrate 11, e.g., in the vicinity of the midpoint of a distance between the opening 10 of the plasma space 3 on the substrate 11-side in FIG. 11A and the ceramic bar-shaped dielectric member 6, and therefore, it is made more difficult for the activated particles generated by the plasma to come in contact with the substrate surface portion located outside the fine linear portion 15.

Figure 11B:
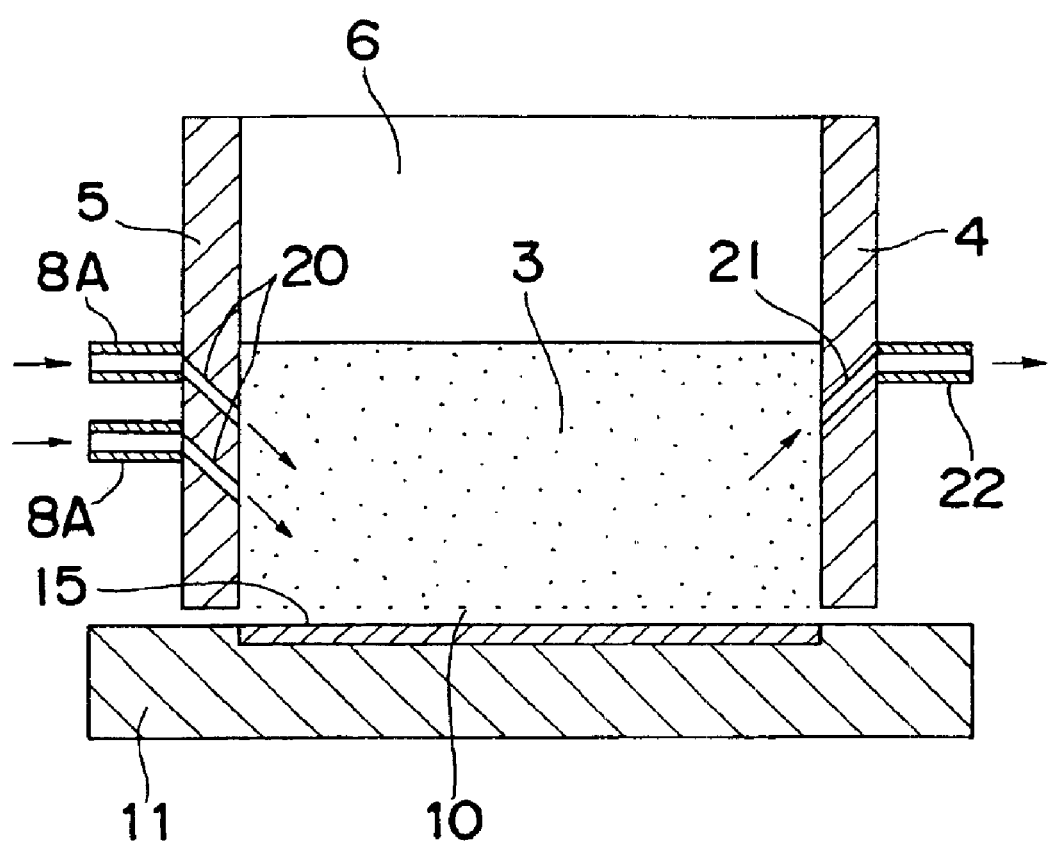

The pipe 8 is not limited in number to one, and it is acceptable to provide two pipes 8A and 8B, form two through holes 20 (one example of the gas supply inlet) corresponding to the two pipes, supply He gas from one pipe 8A and supply a reactant gas from the other pipe 8B, according to a modification example as shown in FIG. 11B.

Figure 13:
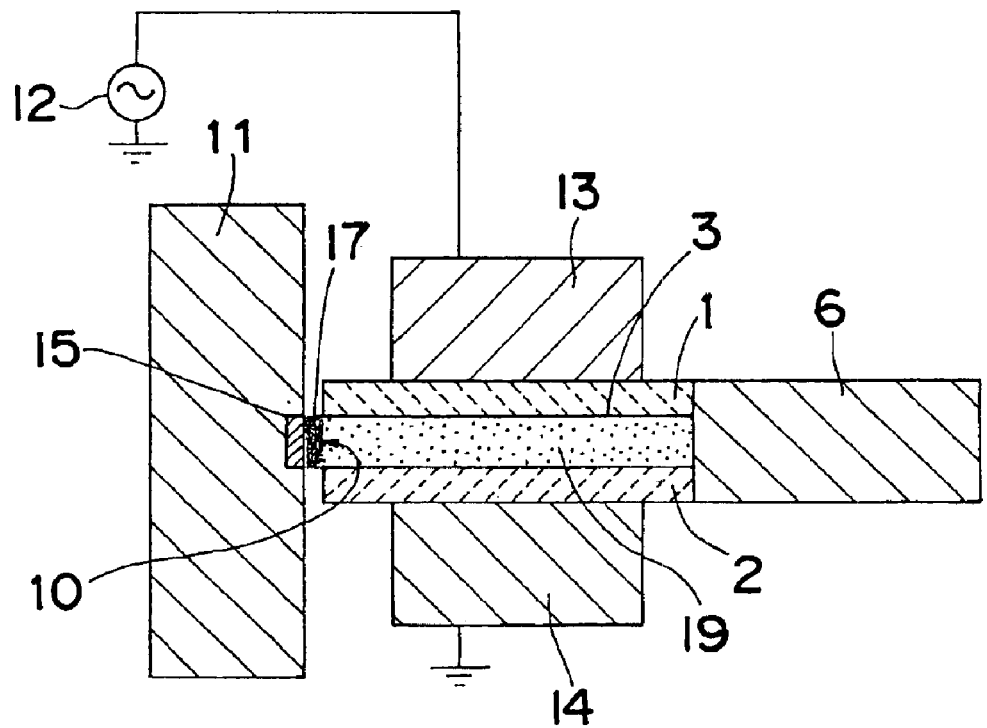
FIG. 13 is a sectional view showing the construction of the plasma processing apparatus employed in the third embodiment of the present invention.

In the third embodiment of the present invention, as one example shown in FIG. 13, a cross-sectional area 19 (dot-hatching portion of FIG. 13) of a cross section obtained by cutting a gas flow passage (roughly the same space as the plasma space 3) by a plane perpendicular to the lengthwise direction of the fine linear portion 15 is twenty-one times as large as a cross-sectional area 17 (rectangular gray portion of FIG. 13) of a cross section obtained by cutting the rectangular parallelepiped, which has the opening 10 of the microplasma source and the fine linear portion 15 of the object as opposite surfaces, by a plane perpendicular to the lengthwise direction of the fine linear portion 15. In order to improve the formation accuracy, the cross-sectional area of the cross section obtained by cutting the gas flow passage by the plane perpendicular to the lengthwise direction of the fine linear portion is required to be larger than the cross-sectional area of the cross section obtained by cutting the rectangular parallelepiped, which has the opening of the microplasma source and the fine linear portion of the object as opposite surfaces, by the plane perpendicular to the lengthwise direction of the fine linear portion. However, in order to obtain higher formation accuracy, this ratio preferably is roughly ten or more times greater. If this ratio is smaller than 10 times, then the activated particles generated by plasma are discharged outwardly of the fine linear portion of the surface of the substrate, and the formation accuracy is degraded.

According to the plasma processing method of the above-mentioned third embodiment of the present invention, microplasma is generated inside the space 3 of the microplasma source by supplying electric power to the member located in the vicinity of the space 3 of the microplasma source, e.g., the microplasma source while supplying the gas into the space 3 of the microplasma source arranged in the vicinity of the substrate 11, and the activated particles discharged from the opening 10 of the microplasma source joined to the space 3 act on the substrate 11 to form the fine linear portion 15 on the surface of the substrate 11. The gas is flowed through the gas flow passage provided parallel to the substrate 11 along the lengthwise direction of the fine linear portion 15, the gas supply to the gas flow passage and the gas exhaustion from the gas flow passage are carried out in the space separated from the space 3 brought in contact with the substrate 11. Therefore, the desired fine linear portion 15 can be accurately processed by plasma.

Furthermore, according to the plasma processing apparatus of the plasma processing apparatus of the seventh inventive aspect of the present application, there are provided the microplasma source disposed in the vicinity of the substrate 11, the gas supply unit 7 for supplying the plasma generating-use gas to the microplasma generating-use space 3 of the microplasma source, and the power supply 12 for supplying electric power to the member located in the vicinity of the plasma space 3 of the microplasma source, e.g., the microplasma source. The microplasma generating-use space 3 of the microplasma source communicates with the gas supply inlet 20, which is arranged separately from the opening 10 of the microplasma source and supplied with the gas to its portion separated from the opening 10 of the microplasma generating-use space 3 and the gas exhaust outlet 21, which is arranged separately from the opening 10 of the microplasma source and from which the gas supplied into the plasma generating-use space 3 is exhausted. The microplasma is generated inside the microplasma generating-use space 3 of the microplasma source while flowing the gas parallel to the substrate 11 along the lengthwise direction of the fine linear portion 15 to be formed on the substrate 11 and in the vicinity of the opening 10 from the gas supply inlet 20 toward the gas exhaust outlet 21 in the portion located apart from the opening 10 of the microplasma generating-use space 3 of the microplasma source, and the activated particles discharged from the opening 10 of the microplasma source communicating with the microplasma generating-use space 3 act on the substrate 11, thereby forming the fine linear portion 15 on the substrate 11. Since the gas flow passage communicating with the gas supply inlet 20 for carrying out the gas supply and the gas exhaust outlet 21 for carrying out the gas exhaustion is formed separately from the microplasma generating-use space 3 located in the vicinity of the substrate 11. Therefore, the desired fine linear portion 15 can be accurately processed by plasma.

A fourth embodiment of the present invention will be described next with reference to FIGS. 14 through 17.

Figure 14:
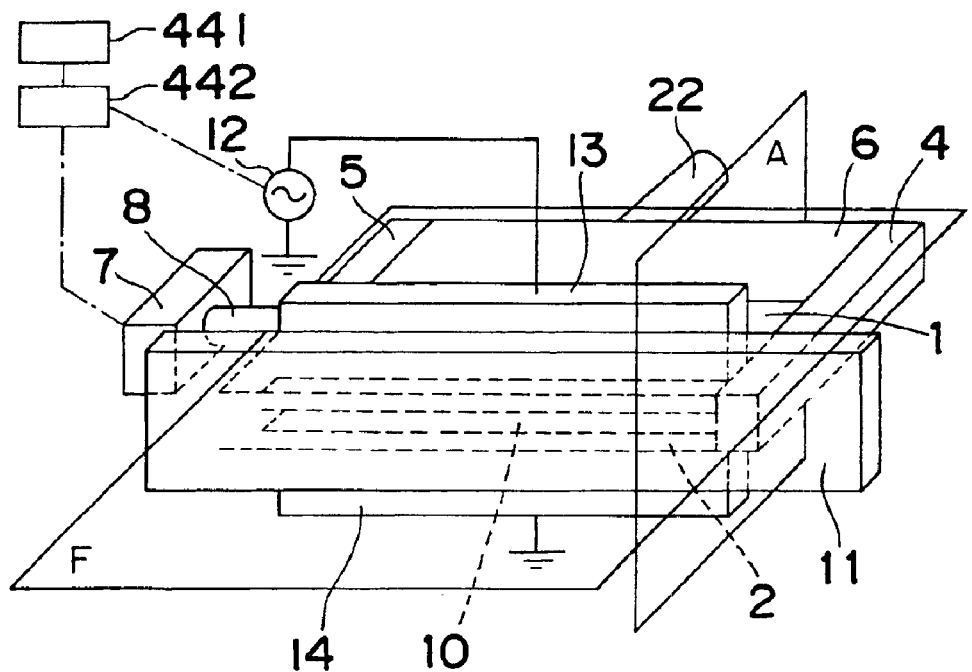
FIG. 14 is a perspective view showing the construction of a plasma processing apparatus employed in a fourth embodiment of the present invention.
Figure 15:
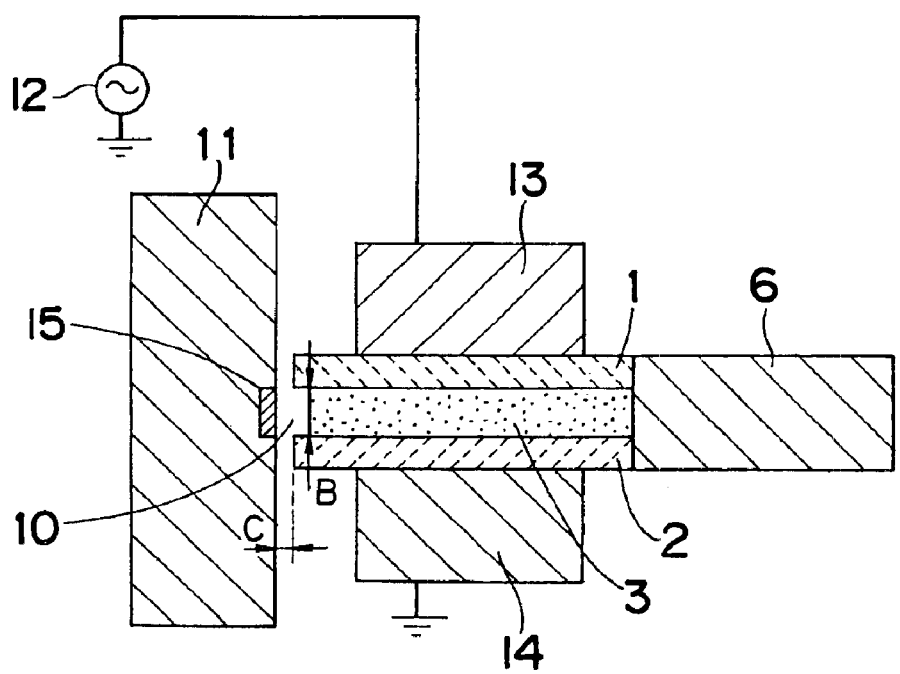
FIG. 15 is a sectional view showing the construction of the plasma processing apparatus employed in the fourth embodiment of the present invention.
Figure 16:
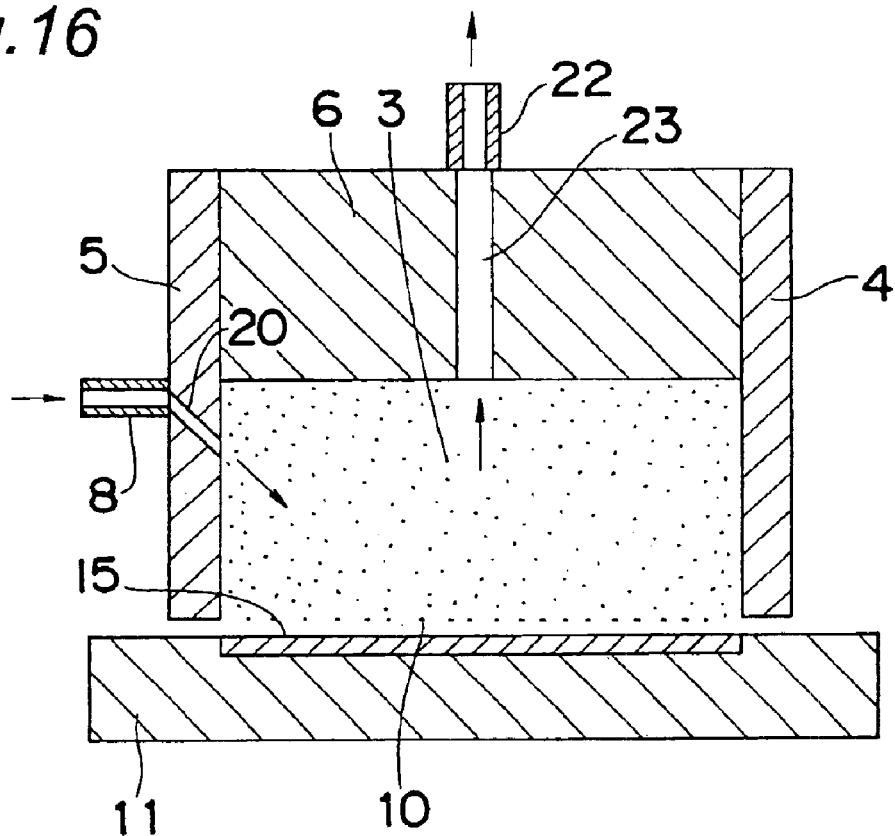
FIG. 16 is a sectional view showing the construction of the plasma processing apparatus employed in the fourth embodiment of the present invention.

FIG. 14 shows a perspective view of a plasma processing apparatus provided with a microplasma source employed in the fourth embodiment of the present invention. FIG. 15 shows a sectional view cut in the plane A of FIG. 14. FIG. 16 shows a sectional view cut in the plane F of FIG. 14. Referring to FIGS. 14, 15, and 16, a microplasma generating-use space 3 (dot-hatching portion of FIGS. 15 and 16, hereinafter referred to as a plasma space 3) of a roughly rectangular parallelepiped shape for generating microplasma is formed between two ceramic dielectric plates 1 and 2. Three side portions of the ceramic dielectric plates 1 and 2 are bonded to ceramic bar-shaped dielectric members 4, 5, and 6, and a substrate 11, which serves as one example of the object, is oppositely disposed with interposition of a minute gap on the remaining one side portion. Gas is supplied from a gas supply unit 7 to the plasma space 3 via a pipe 8 and a slant through hole 20 (one example of the gas supply inlet) which is formed in the ceramic bar-shaped dielectric member 5 and inclined toward the substrate 11. The gas is exhausted from a pipe 22 via a through hole 23 (one example of the gas exhaust outlet) which is formed from the plasma space 3 in an approximate center portion of the ceramic bar-shaped dielectric member 6 so as to extend in a direction perpendicular to the surface of the substrate 11 toward the side opposite from the substrate 11. By arranging an elongated rectangular opening 10 of the microplasma source in the vicinity of the substrate 11 that serves as the object, so that the gas inside the plasma space 3 is exhausted toward the side opposite from the substrate 11 from the through hole 23 of the ceramic bar-shaped dielectric member 6 while gas is supplied into the plasma space 3 from the through hole 20 of the ceramic bar-shaped dielectric member 5 to flow the gas parallel to the substrate 11 along the lengthwise direction of the opening 10 in the vicinity of the opening 10. By supplying high-frequency power of 13.56 MHz from a high-frequency power supply 12 to a high-frequency electrode 13 and grounding a grounding electrode 14, plasma is generated in the plasma space 3, and the activated particles discharged from the opening 10 of the microplasma source act on the substrate 11, allowing a fine linear portion 15 to be formed on the surface of the substrate 11. It is to be noted that the high-frequency electrode 13 and the grounding electrode 14 are parallel plate electrodes provided so as to place the plasma space 3 between them. Moreover, as one example, the width B of the opening 10 of the microplasma source is 1 mm, and the distance C between the opening 10 of the microplasma source and the substrate 11 is 0.1 mm. The place of the through hole 23 is not limited to the approximate center portion of the ceramic bar-shaped dielectric member 6, and it is acceptable to form the through hole 23 in an arbitrary portion so long as the portion is apart from the through hole 20.

The microplasma source, which is operable at several pascals to several times the atmospheric pressure, typically operates within a range of a pressure of 10000 Pa to about triple the atmospheric pressure. In particular, the operation at or around the atmospheric pressure, which requires neither strict sealing structure nor special exhaust unit and appropriately restrains the diffusion of the plasma and the activated particles, is especially preferable.

Figure 17:
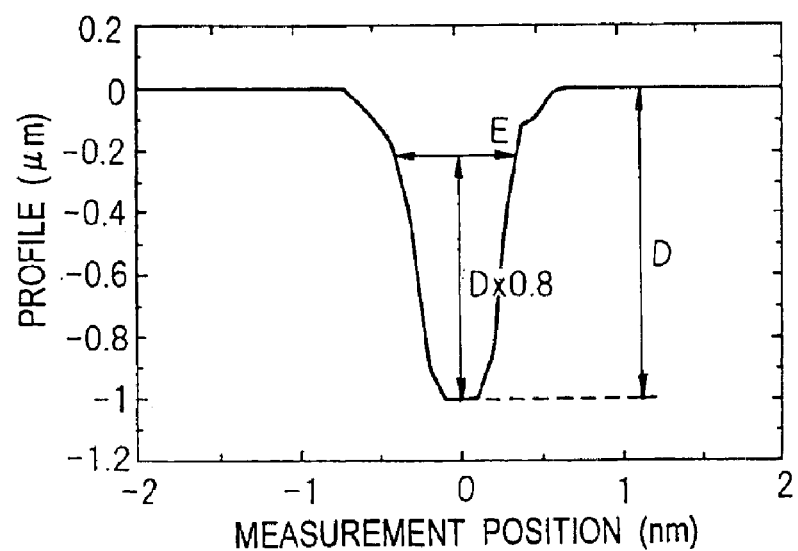
FIG. 17 is a graph showing an etching profile in the fourth embodiment of the present invention.

As one concrete example, a molybdenum thin film, which served as one example of the fine linear portion 15 formed on the substrate 11 on the condition that He was supplied by 2000 sccm and $CF_4$ was supplied by 4 sccm, as a gas, and high-frequency power of 30 W was supplied, was subjected to an etching process. Consequently, an etching profile as shown in FIG. 17 was obtained. In this case, on the assumption that the depth of the portion most deeply etched was D and the width of the portion shallower by D×0.8 than the bottom of the pattern was a processing width E, then E was 0.79 mm. Since the width B of the opening 10 of the microplasma source was 1 mm, the processing width E was smaller than this, and the formation accuracy was remarkably improved in comparison with the prior art example.

The reason why the formation accuracy is improved as described above is presumably because the gas supply to the plasma space 3 is carried out from the through hole 20 that serves as a minute hole provided for the ceramic bar-shaped dielectric member 5 that serves as one example of wall surfaces that surround the plasma space 3, and the gas exhaustion from the plasma space 3 is carried out through the plasma space 3 from the through hole 23 formed in the ceramic bar-shaped dielectric member 6 in the direction opposite from the substrate 11, and therefore, it is made more difficult for the activated particles generated by the plasma to come in contact with the substrate surface portion located outside the fine linear portion 15. One example of the through hole 20 that serves as the minute hole has a diameter of not greater than 1 mm or more preferably has a diameter of 0.2 mm to 0.5 mm.

According to the plasma processing method of the fourth embodiment of the present invention, microplasma is generated in the microplasma generating-use space 3 of the microplasma source by supplying electric power to the member located in the vicinity of the microplasma generating-use space 3 of the microplasma source (e.g., at least one of the electrode provided on the side opposite from the surface to be processed of the substrate 11, the substrate 11, and the microplasma source) while supplying the gas into the microplasma generating-use space 3 of the microplasma source arranged in the vicinity of the substrate 11, and the activated particles discharged from the opening 10 of the microplasma source joined to the microplasma generating-use space 3 act on the substrate 11 to form the fine linear portion 15 on the substrate 11. By carrying out the gas supply to the microplasma generating-use space 3 for generating the microplasma from the through hole 20 provided at the wall surface 5 that surrounds the microplasma generating-use space 3 for generating the microplasma and carrying out the gas exhaustion from the microplasma generating-use space 3 for generating the microplasma through the microplasma generating-use space 3 for generating the microplasma oppositely from the side on which the fine linear portion 15 of the substrate 11 is arranged. By this operation, the fine linear portion 15 is formed on the substrate 11 while flowing the gas parallel to the substrate 11 along the lengthwise direction of the fine linear portion 15 and in the vicinity of the opening 10. Therefore, the desired fine linear portion 15 can be accurately processed by plasma.

According to the plasma processing apparatus of the fourth embodiment of the present invention, there are provided the microplasma source disposed in the vicinity of the substrate 11, the gas supply unit 7 for supplying the plasma generating-use gas to the microplasma generating-use space 3 of the microplasma source, and the power supply 12 for supplying electric power to the member located in the vicinity of the plasma space 3 of the microplasma source (e.g., at least one of the electrode provided on the side opposite from the surface to be processed of the substrate 11, the substrate 11, and the microplasma source). The microplasma generating-use space 3 of the microplasma source communicates with the gas supply inlet 20 to which the gas is supplied and the gas exhaust outlet 23, which is provided separately from the opening 10 of the microplasma source opposite to the substrate 11 and from which the gas supplied into the microplasma generating-use space 3 is exhausted. The microplasma is generated inside the microplasma generating-use space 3 of the microplasma source while flowing the gas parallel to the substrate 11 along the lengthwise direction of the fine linear portion 15 to be formed on the substrate 11 and in the vicinity of the opening 10 from the gas supply inlet 20 toward the gas exhaust outlet 23 inside the microplasma generating-use space 3 of the microplasma source to make the activated particles discharged from the opening 10 of the microplasma source communicating with the microplasma generating-use space 3 act on the substrate 11, thereby forming the fine linear portion 15 on the substrate 11. The gas supply to the microplasma generating-use space 3 for generating the microplasma by means of the gas supply unit 7 is carried out from the through hole 20 provided at the ceramic bar-shaped dielectric member 5 that surrounds the microplasma generating-use space 3 for generating microplasma, and the gas exhaustion from the microplasma generating-use space 3 for generating the microplasma is carried out through the microplasma generating-use space 3 for generating the microplasma oppositely from the opening 10 of the microplasma source. Therefore, the desired fine linear portion 15 can be accurately processed by plasma.

Figure 18:
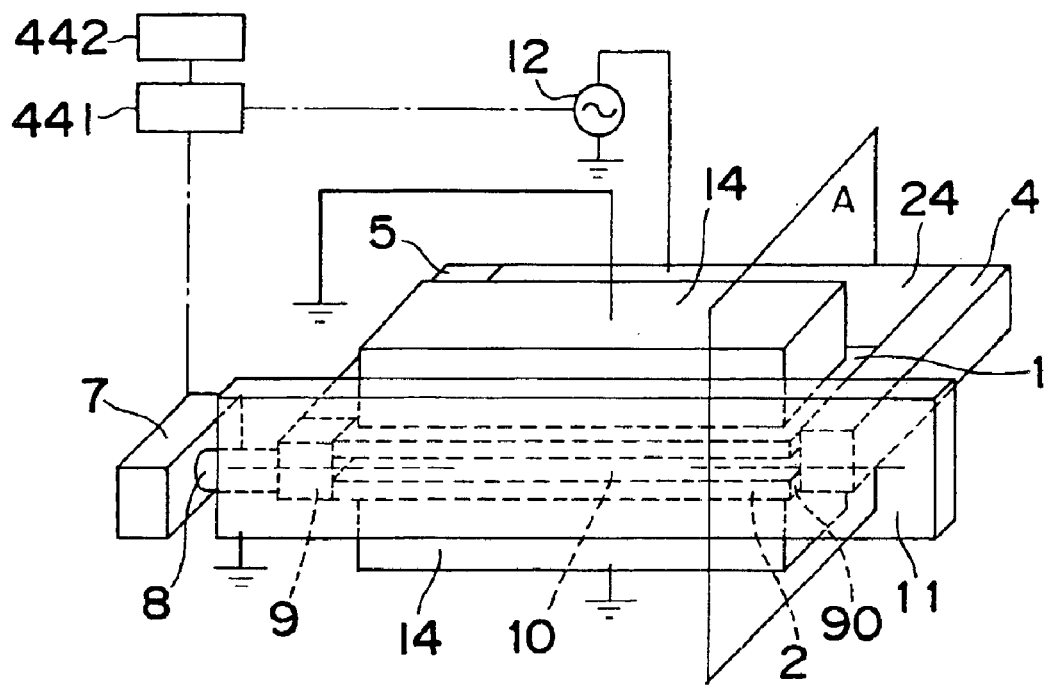
FIG. 18 is a perspective view showing the construction of a plasma processing apparatus employed in a fifth embodiment of the present invention.
Figure 19:
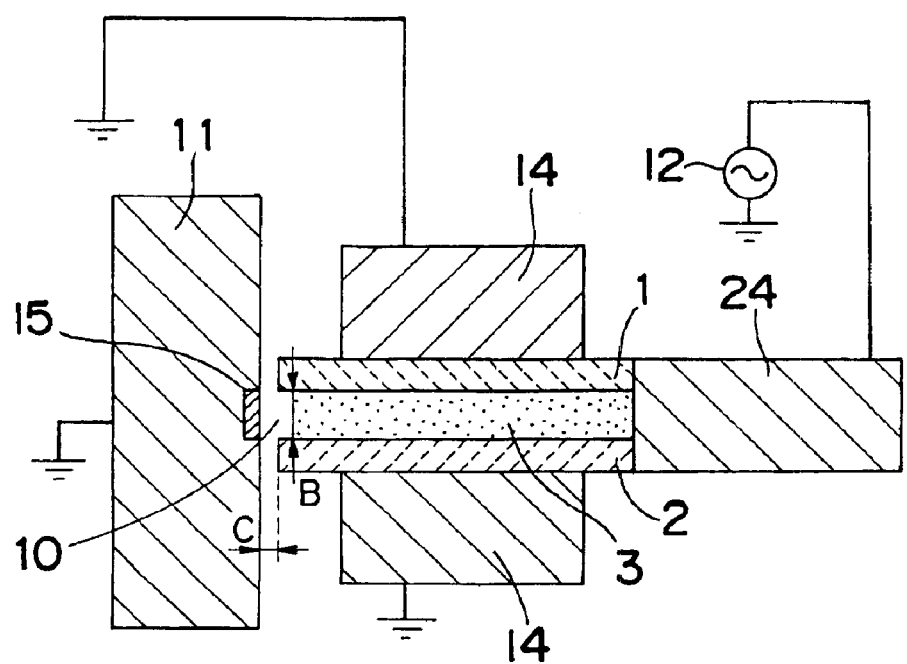
FIG. 19 is a sectional view showing the construction of the plasma processing apparatus employed in the fifth embodiment of the present invention.

Although there has been exemplarily described the case where the high-frequency power is supplied across the parallel plate electrodes 1 and 2 provided so as to place the space 3 for generating the microplasma between them in the first through fourth embodiments of the present invention, the present invention is not limited to the above-mentioned system. For example, as in the fifth embodiment of the present invention shown in FIGS. 18 and 19, it is also possible to supply high-frequency power across the grounded object 11 to be processed and an electrode 24 opposite to the object 11 to be processed that is a conductor as one example of the member located in the vicinity of the space 3 of the microplasma source, via the space 3 for generating the microplasma. In this case, each of the parallel plate electrodes 14, which are provided in the upper and lower portions in FIG. 19 so as to place the space 3 for generating microplasma between them, is a grounding electrode. The other construction is similar to that of the first embodiment of the present invention, and therefore, no description is herein provided therefor. It is to be noted that FIG. 19 is a sectional view cut in the plane A of FIG. 18.

Figure 20:
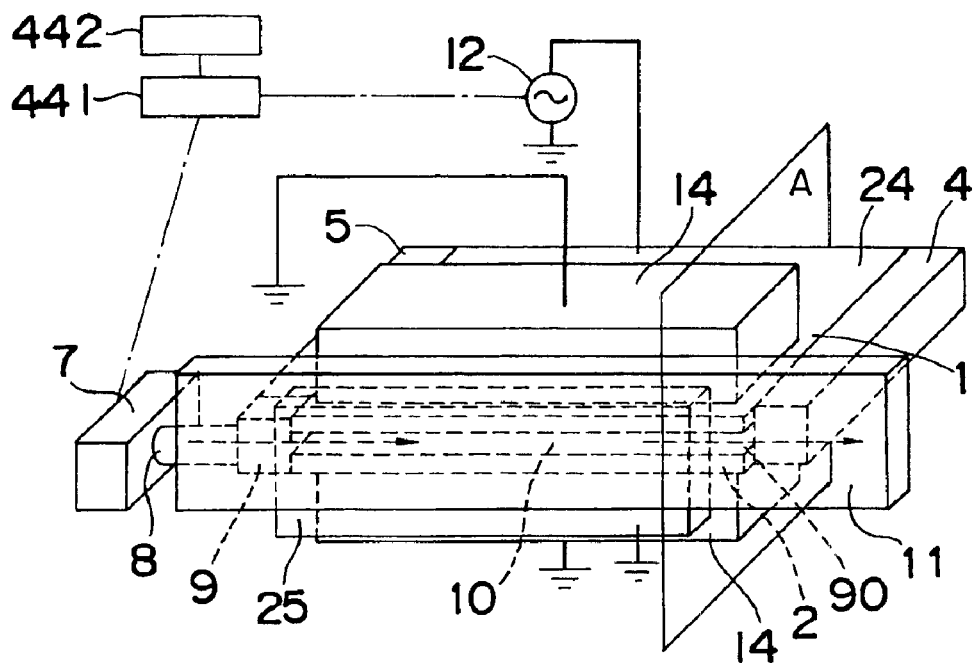
FIG. 20 is a perspective view showing the construction of a plasma processing apparatus employed in a sixth embodiment of the present invention.
Figure 21:
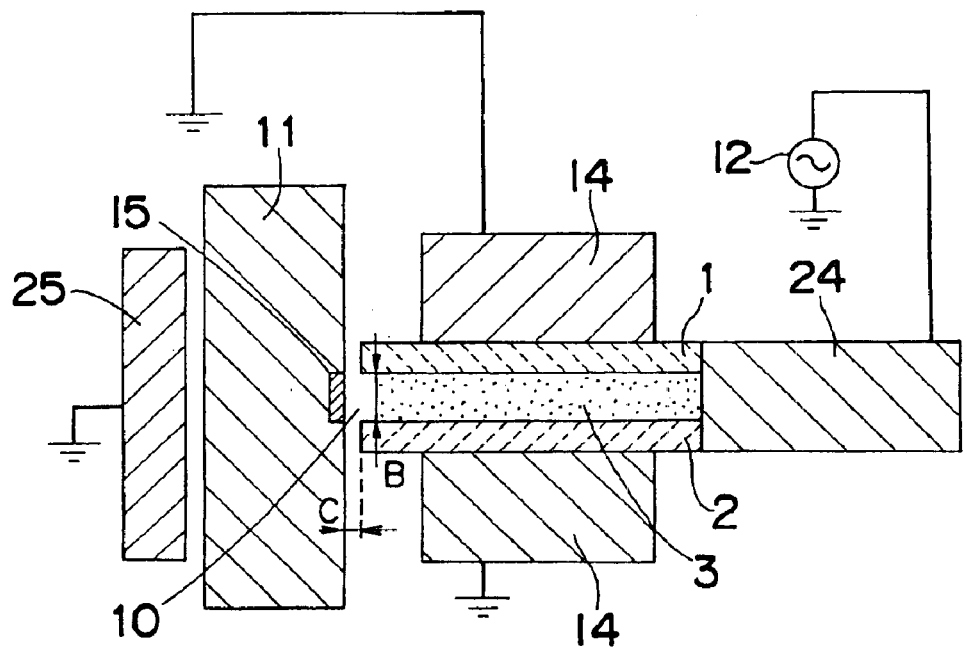
FIG. 21 is a sectional view showing the construction of the plasma processing apparatus employed in the sixth embodiment of the present invention.
Figure 24:
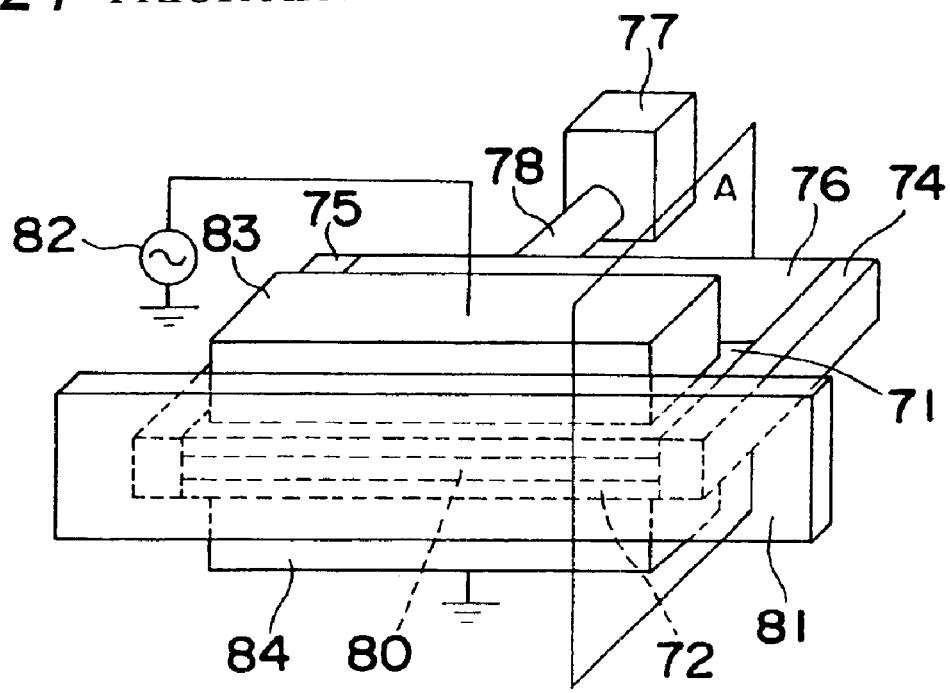
FIG. 24 is a perspective view showing the construction of a plasma processing apparatus employed in a prior art example.
Figure 25:
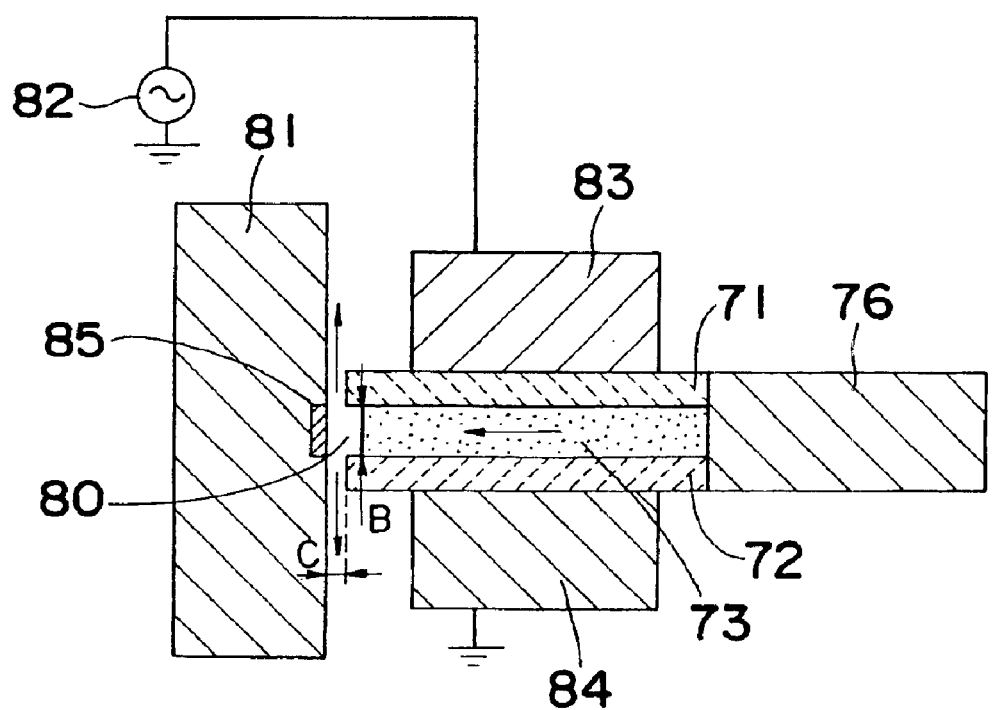
FIG. 25 is a sectional view showing the construction of the plasma processing apparatus employed in the prior art example.
Figure 26:
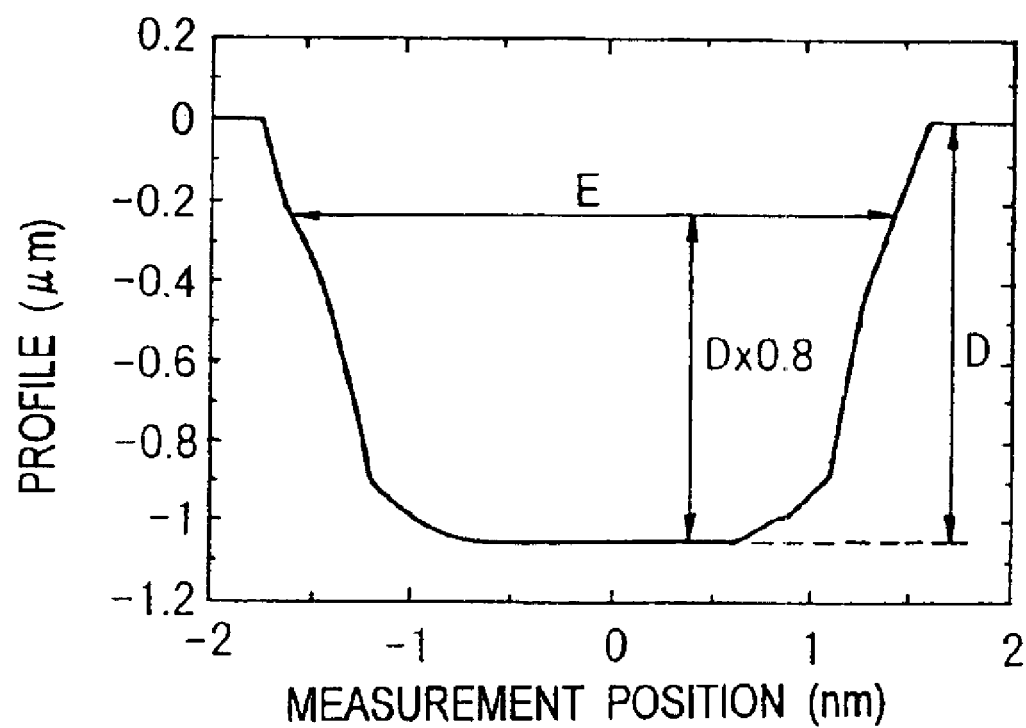
FIG. 26 is a graph showing an etching profile in the prior art example.

Otherwise, as in the sixth embodiment of the present invention shown in FIGS. 20 through 21, it is possible to supply high-frequency power across an electrode 24 opposite to the object 11 to be processed, which is a dielectric substance, via the space 3 for generating microplasma, and the electrodes 25, which is provided as one example of the member located in the vicinity of the space 3 of the microplasma source on the side opposite from the surface to be processed of the substrate 11 with interposition of a gap or in contact. In this case, each of the parallel plate electrodes 14, which are provided so as to place the microplasma generating-use space 3 between them, is a grounding electrode. The other construction is similar to that of the first embodiment of the present invention, and therefore, no description is herein provided therefor. It is to be noted that FIG. 21 is a sectional view cut in the plane A of FIG. 20.

There have been exemplarily described the case where the parallel plate electrodes 14 provided with interposition of the space 3 for generating microplasma are grounded in the fifth or sixth embodiment of the present invention. By adopting the above-mentioned arrangement, there is the effect of suppressing the diffusion of plasma to the portion other than the space 3 for generating microplasma. However, depending on the dimensions of components and the type of gas, in some cases, the microplasma can be generated without trouble even if the parallel plate electrodes 14 are removed.

Moreover, although there has been exemplarily described the case where the gas is supplied from the gas supply unit 7 to the plasma space 3 via the pipe 8 and the slant through hole 20 formed in the ceramic bar-shaped dielectric member 5 in the fourth embodiment of the present invention. However, as described in connection with the seventh embodiment of the present invention shown in FIG. 22, it is acceptable to carry out gas supply through a gas flow passage (one example of the gas supply inlet) constructed of a through hole provided at the one flat plate electrode 13 of the parallel plate electrodes 13 and 14 penetratively to the plasma space 3 and a through hole provided at the ceramic dielectric plate 1. In this case, a through hole that serves as a gas flow passage is provided inside the high-frequency electrode 13, and the gas is supplied to the plasma space 3 from the gas supply unit 7 via the above through hole and the through hole provided at the ceramic dielectric plate 1 communicating with the through hole. The other construction is similar to that of the fourth embodiment of the present invention, and therefore, no description is herein provided therefor. Of course, conversely to this, it is acceptable to provide a construction in which a through hole as a gas flow passage is provided at the grounding electrode 14 and the gas is supplied to the plasma space 3 from the gas supply unit 7 via the above through hole and a through hole provided at the ceramic dielectric plate 2 communicating with the through hole.

Although there has been exemplarily described the case where the parallel plate capillary type is employed as a microplasma source in the aforementioned first through seventh embodiments of the present invention, it is possible to employ a variety of microplasma sources of another system capillary type such as an inductive coupling capillary type, a micro gap system, an inductive coupling tube type, and so on.

Moreover, by supplying a DC voltage or high-frequency power to the object to be processed, or the electrode provided on the side opposite from the surface to be processed of the object to be processed, the action of guiding ions in microplasma or, in other words, activated particles so that the activated particles come in contact with the fine linear portion 15 of the substrate 11 can be enhanced.

Moreover, there has been exemplarily described the case where the molybdenum thin film on the substrate 11 is subjected to the plasma processing by an etching process. However, the object to be subjected to the plasma processing is not limited to them, and the present invention can be applied to the plasma processing of a variety of substrates (for example, substrate whose surface to be processed is a flat surface) or to the plasma processing of an object to be processed coated with a variety of films (for example, plasma processing of a flat surface coated with a variety of films of the object to be processed). The object to be processed is not limited to a substrate of a dielectric substance and is allowed to be an arbitrary member constructed of a material other than the dielectric substance. Moreover, it is possible to carry out plasma processing by etching with a photoresist, a resin represented by polyimide, or the like using a mixed gas of He and $O_2$. Moreover, it is possible to subject a sheet-shaped object to be processed to plasma processing by continuous etching processing of the object into a fine linear shape while the object is being conveyed by a roll-to-roll system. Otherwise, the plasma processing can be carried out on the surface of a variety of objects to be processed by thin film deposition according to the plasma CVD method.

Moreover, the fine linear portion 15 of the substrate 11 is not limited to the thin film formed in the recess of the substrate 11 as illustrated in connection with the aforementioned embodiments and is allowed to be a thin film as a protruding portion protrudingly formed on the surface of the substrate 11.

Moreover, although there has been exemplarily described the case where the microplasma is generated by the high-frequency power of 13.56 MHz, the microplasma can be generated by using high-frequency power within a range of several hundred kilohertz to several gigahertz. It is otherwise possible to generate high-efficiency plasma by supplying pulse power while restraining shift to arc discharge.

Moreover, although there has been exemplarily described the case where the width of the opening 10 of the microplasma source is 1 mm, the width of the opening 10 of the microplasma source is not limited to this and preferably is roughly not smaller than 0.01 mm and not greater than 5 mm. The reason why the width of the opening 10 is not greater than 5 mm is that the activated particles generated by plasma highly possibly come in contact with the outside of the fine linear portion of the substrate surface when the width exceeds 5 mm, failing in processing by plasma only the region limited to the fine linear portion 15. Furthermore, the width of the opening of the microplasma source more preferably is not smaller than 0.01 mm and not greater than 1 mm. The reason why the width of the opening 10 is not greater than 1 mm is that the activated particles generated by plasma become hard to come in contact with the outside of the fine linear portion 15 on the surface of the substrate 11 as the width of the opening 10 of the microplasma source is smaller, providing an advantage that only the region limited to the fine linear portion 15 can be more reliably subjected to the plasma processing. On the other hand, considering the accuracy of the plasma processing of the components that constitute the microplasma source and a change in shape with the lapse of time and so on due to repetitive processing, the width is prevented from being extremely reduced. Therefore, the width of the opening 10 preferably is not smaller than 0.01 mm.

Moreover, although there has been exemplarily described the case where the distance between the opening 10 of the microplasma source and the object to be processed, e.g., the substrate 11 is 0.1 mm, the distance between the opening 10 of the microplasma source and the object to be processed is not limited to this and preferably is roughly not smaller than 0.01 mm and not greater than 1 mm. The reason why the above-mentioned distance is not greater than 1 mm is that the activated particles generated by plasma highly possibly come in contact with the outside of the fine linear portion of the substrate surface when the distance exceeds 1 mm, failing in processing by plasma only the region limited to the fine linear portion. Furthermore, the distance between the opening of the microplasma source and the object to be processed more preferably is not smaller than 0.01 mm and not greater than 0.5 mm. The reason why the above-mentioned distance is not greater than 0.5 mm is that the activated particles generated by plasma become hard to come in contact with the outside of the fine linear portion on the surface of the substrate as the distance between the opening of the microplasma source and the object to be processed is smaller, providing an advantage that only the region limited to the fine linear portion can be more reliably subjected to the plasma processing. On the other hand, considering the accuracy of the plasma processing of the components that constitute the microplasma source, a change in shape with the lapse of time due to repetitive processing, and further the reproducibility and stability of the distance between the opening of the microplasma source and the object to be processed, the distance is prevented from being extremely reduced. Therefore, the distance is considered to be preferably not smaller than 0.01 mm.

In the aforementioned respective embodiments, it is acceptable to reverse the direction of gas supply and exhaustion by making the gas supply inlet function as a gas exhaust outlet and making the gas exhaust outlet as a gas supply inlet.

Moreover, in the aforementioned respective embodiments, if the gas supplied from the gas supply inlets 9 and 20 to the space 3 or the gas flow passage is exhausted by 70% or more in terms of the supply flow rate from the gas exhaust outlet 90, then the gas can be more reliably prevented from being exhausted from the opening 10 to allow the activated particles to be prevented from effusing from the opening 10, making it possible to prevent the plasma processing from being carried out in a wide range beyond the desired fine linear portion 15.

As is apparent from the above description, according to the plasma processing method of the first inventive aspect of the present application, microplasma is generated in the space of the microplasma source by supplying electric power to the member (e.g., at least one of the electrode provided on the side opposite from the surface to be processed of the object to be processed, the object to be processed, and the microplasma source) located in the vicinity of the space of the microplasma source while supplying the gas into the space of the microplasma source arranged in the vicinity of the object to be processed, and the activated particles discharged from the opening of the microplasma source joined to the space act on the object to be processed, forming the fine linear portion on the object to be processed. Accordingly, the fine linear portion is formed on the object to be processed while flowing the gas parallel to the object to be processed along the lengthwise direction of the fine linear portion and in the vicinity of the opening. Therefore, the desired fine linear portion can be accurately processed by plasma.

Moreover, according to the plasma processing method of the second inventive aspect of the present application, microplasma is generated in the space of the microplasma source by supplying electric power to the member (e.g., at least one of the electrode provided on the side opposite from the surface to be processed of the object to be processed, the object to be processed, and the microplasma source) located in the vicinity of the space of the microplasma source while supplying the gas into the space of the microplasma source arranged in the vicinity of the object to be processed, and the activated particles discharged from the opening of the microplasma source joined to the space act on the object to be processed, forming the fine linear portion on the object to be processed. Accordingly, the fine linear portion is formed on the object to be processed while flowing the gas through the gas flow passage provided parallel to the object to be processed along the lengthwise direction of the fine linear portion and discharging the activated particles from the opening narrower than the gas flow passage. Therefore, the desired fine linear portion can be accurately processed by plasma.

Moreover, according to the plasma processing method of the third inventive aspect of the present application, microplasma is generated in the space of the microplasma source by supplying electric power to the member (e.g., at least one of the electrode provided on the side opposite from the surface to be processed of the object to be processed, the object to be processed, and the microplasma source) located in the vicinity of the space of the microplasma source while supplying the gas into the space of the microplasma source arranged in the vicinity of the object to be processed, and the activated particles discharged from the opening of the microplasma source joined to the space act on the object to be processed, forming the fine linear portion on the object to be processed. Accordingly, the fine linear portion is formed on the object to be processed while flowing the gas through the gas flow passage provided parallel to the object to be processed along the lengthwise direction of the fine linear portion and carrying out the gas supply to the gas flow passage and the gas exhaustion from the gas flow passage in the space separated from the space to be brought in contact with the object to be processed. Therefore, the desired fine linear portion can be accurately processed by plasma.

Moreover, according to the plasma processing method of the fourth inventive aspect of the present application, microplasma is generated in the space of the microplasma source by supplying electric power to the member (e.g., at least one of the electrode provided on the side opposite from the surface to be processed of the object to be processed, the object to be processed, and the microplasma source) located in the vicinity of the space of the microplasma source while supplying the gas into the space of the microplasma source arranged in the vicinity of the object to be processed, and the activated particles discharged from the opening of the microplasma source joined to the space act on the object to be processed, forming the fine linear portion on the object to be processed. Accordingly, the fine linear portion is formed on the object to be processed while flowing the gas parallel to the object to be processed along the lengthwise direction of the fine linear portion and in the vicinity of the opening by carrying out the gas supply to the space for generating microplasma from the through hole provided at the wall surface that surrounds the space for generating microplasma and carrying out the gas exhaustion from the space for generating microplasma through the space for generating microplasma in the direction opposite from the side on which the fine linear portion of the object to be processed is disposed. Therefore, the desired fine linear portion can be accurately processed by plasma.

Moreover, according to the plasma processing apparatus of the fifth inventive aspect of the present application, there are provided the microplasma source arranged in the vicinity of the object to be processed, the gas supply unit for supplying the plasma generating-use gas to the space of the microplasma source and the power supply for supplying electric power to the member (e.g., at least one of the electrode provided on the side opposite from the surface to be processed of the object to be processed, the object to be processed, and the microplasma source) located in the vicinity of the space of the microplasma source. The above-mentioned space of the microplasma source communicates with the gas supply inlet to which the gas is supplied and the gas exhaust outlet, which is provided separately from the opening of the microplasma source opposite to the object to be processed and from which the gas supplied into the space is exhausted. The microplasma is generated inside the space of the microplasma source while flowing the gas parallel to the object to be processed along the lengthwise direction of the fine linear portion to be formed on the object to be processed and in the vicinity of the opening from the gas supply inlet toward the gas exhaust outlet in the space of the microplasma source to make the activated particles discharged from the opening of the microplasma source communicating with the space act on the object to be processed, thereby forming the fine linear portion on the object to be processed. Therefore, the desired fine linear portion can be accurately processed by plasma.

Moreover, according to the plasma processing apparatus of the sixth inventive aspect of the present application, there are provided the microplasma source arranged in the vicinity of the object to be processed, the gas supply unit for supplying the plasma generating-use gas to the microplasma generating-use space of the microplasma source, and the power supply for supplying electric power to the member (e.g., at least one of the electrode provided on the side opposite from the surface to be processed of the object to be processed, the object to be processed, and the microplasma source) located in the vicinity of the space of the microplasma source. The microplasma generating-use space of the microplasma source is provided with a gas flow passage space separately from the opening of the microplasma source, and this gas flow passage space communicates with the gas supply inlet to which the gas is supplied and the gas exhaust outlet, which is provided separately from the opening of the microplasma source opposite to the object to be processed and from which the gas supplied into the gas flow passage space is exhausted. The microplasma is generated inside the microplasma generating-use space of the microplasma source while flowing the gas parallel to the object to be processed along the lengthwise direction of the fine linear portion to be formed on the object to be processed and in the vicinity of the opening from the gas supply inlet toward the gas exhaust outlet in the gas flow passage space of the microplasma source to make the activated particles discharged from the opening of the microplasma source communicating with the space act on the object to be processed, forming the fine linear portion on the object to be processed. The gas flow passage is provided parallel to the object to be processed along the lengthwise direction of the fine linear portion, and the opening is narrower than the gas flow passage. Therefore, the desired fine linear portion can be accurately processed by plasma.

Moreover, according to the plasma processing apparatus of the seventh inventive aspect of the present application, there are provided the microplasma source arranged in the vicinity of the object to be processed, the gas supply unit for supplying the plasma generating-use gas to the microplasma generating-use space of the microplasma source, and the power supply for supplying electric power to the member (e.g., at least one of the electrode provided on the side opposite from the surface to be processed of the object to be processed, the object to be processed, and the microplasma source) located in the vicinity of the space of the microplasma source. The microplasma generating-use space of the microplasma source communicates with the gas supply inlet, which is arranged separately from the opening of the microplasma source and through which the gas is supplied to a portion located apart from the opening in the microplasma generating-use space and the gas exhaust outlet, which is arranged separately from the opening of the microplasma source and from which the gas supplied into the microplasma generating-use space is exhausted. The microplasma is generated inside the microplasma generating-use space of the microplasma source while flowing the gas parallel to the object to be processed, along the lengthwise direction of the fine linear portion to be formed on the object to be processed, in the vicinity of the opening, from the gas supply inlet toward the gas exhaust outlet in a portion separately from the opening in the microplasma generating-use space of the microplasma source to make the activated particles discharged from the opening of the microplasma source communicating with the space act on the object to be processed, forming the fine linear portion on the object to be processed. Accordingly, the gas flow passage, which communicates with the gas supply inlet for carrying out the gas supply and the gas exhaust outlet for carrying out the gas exhaustion, is formed separately from the microplasma generating-use space located adjacent to the object to be processed. Therefore, the desired fine linear portion can be accurately processed by plasma.

Moreover, according to the plasma processing apparatus of the eighth inventive aspect of the present application, there are provided the microplasma source arranged in the vicinity of the object to be processed, the gas supply unit for supplying the plasma generating-use gas to the microplasma generating-use space of the microplasma source, and the power supply for supplying electric power to the member (e.g., at least one of the electrode provided on the side opposite from the surface to be processed of the object to be processed, the object to be processed, and the microplasma source) located in the vicinity of the space of the microplasma source. The microplasma generating-use space of the microplasma source communicates with the gas supply inlet to which the gas is supplied and the gas exhaust outlet, which is arranged separately from the opening of the microplasma source located opposite from the microplasma generating-use space and from which the gas supplied into the microplasma generating-use space is exhausted. The microplasma is generated inside the microplasma generating-use space of the microplasma source while flowing the gas parallel to the object to be processed, along the lengthwise direction of the fine linear portion to be formed on the object to be processed, in the vicinity of the opening, from the gas supply inlet toward the gas exhaust outlet in the microplasma generating-use space of the microplasma source to make the activated particles discharged from the opening of the microplasma source communicating with the microplasma generating-use space act on the object to be processed, forming the fine linear portion on the object to be processed. Accordingly, the gas supply to the microplasma generating-use space for generating the microplasma by the gas supply unit is carried out from the through hole provided at the wall surface that surrounds the microplasma generating-use space for generating the microplasma, and the gas exhaustion from the microplasma generating-use space for generating the microplasma is carried out through the microplasma generating-use space for generating the microplasma in the direction opposite from the opening of the microplasma source. Therefore, the desired fine linear portion can be accurately processed by plasma.

The plasma processing methods and apparatuses of the eighth through tenth embodiments of the present invention, which are able to form a pattern by processing a minute region at low cost without using a mask pattern in addition to the aforementioned object, will be described below.

Before describing the contents of the eighth through tenth embodiments, prior art techniques will be described first.

As a prior art plasma processing apparatus, there are known ones disclosed in, for example, Japanese Unexamined Patent Publication No. 2000-164395 and Japanese Unexamined Patent Publication No. 9-27482.

Figure 32:
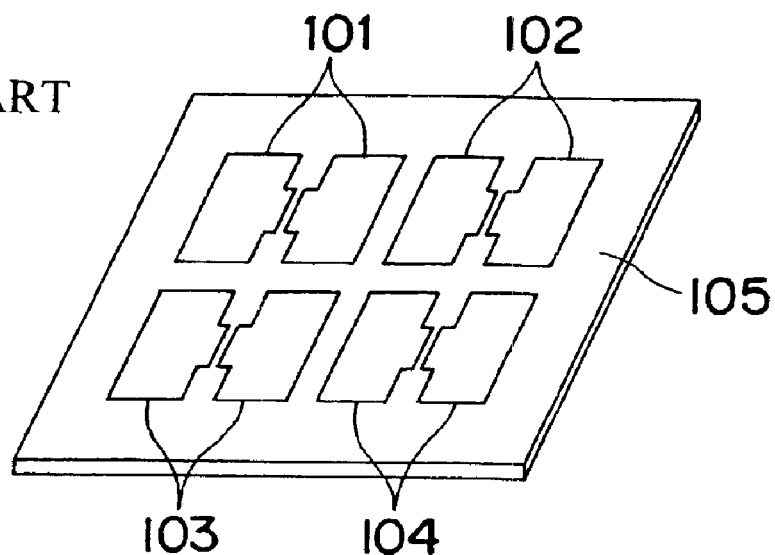
FIG. 32 is a perspective view showing the construction of a plasma processing apparatus of a first prior art example.

Explaining the substrate electrode plasma generating apparatus disclosed in Japanese Unexamined Patent Publication No. 2000-164395 with reference to FIG. 32, the apparatus is constructed of an array of minute-gap thin-film electrode pairs 101, 102, 103, and 104 formed by sputter deposition of tungsten on a silicon substrate 105 whose surface is oxidized and thereafter dry etching the same. Plasma is generated on the minute-gap thin-film electrode pairs 101, 102, 103, and 104 by supplying high-frequency power to the minute-gap thin-film electrode pairs 101, 102, 103, and 104 disposed on the silicon substrate 105, and plasma processing such as etching, deposition, surface reforming, or the like is carried out.

Figure 33:
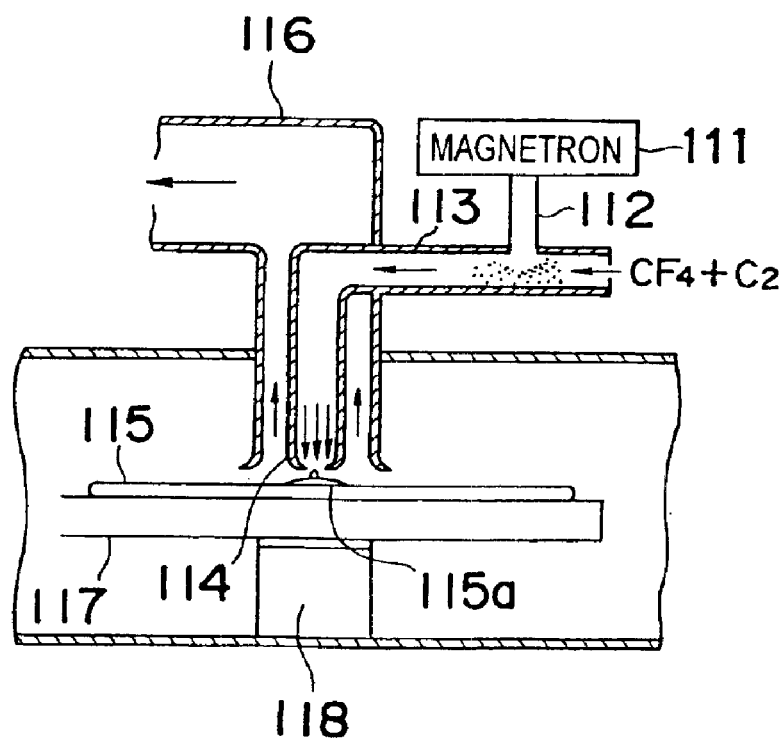
FIG. 33 is a sectional view showing the construction of a plasma processing apparatus of a second prior art example.

Explaining the plasma etching apparatus using microwave disclosed in Japanese Unexamined Patent Publication No. 9-27482 with reference to FIG. 33, microwave of 2.45 GHz generated by a magnetron 111 is applied to a mixed gas of $CF_4$ and oxygen that are passing through a reactive gas supply pipe 113 via a waveguide 112, making plasma of the reactive gas. The reactive gas put in the plasma state is applied from a nozzle 114 to a projecting portion 115a of a wafer 115, and the projecting portion 115a is etched. A reaction product generated during etching is sucked from a suction port of a reaction product discharge pipe 116 provided coaxially around the periphery of the reactive gas supply pipe 113 and then exhausted to the outside.

Moreover, in order to locally etch the surface of the wafer 115, there is provided a construction in which the wafer 115 is fixed by suction to a movable carriage 117, and the movable carriage 117 is moved in the X, Y, and θ directions by a drive means 118.

However, the aforementioned conventional systems have an issue that the plasma processing for forming a pattern by processing a minute region at low cost is difficult.

In the substrate electrode plasma generating apparatus of FIG. 32, only the region located adjacent to the array of the minute-gap thin-film electrode pairs 101 through 104 provided on the silicon substrate 105 can be processed by plasma. Therefore, in order to form the desired pattern, it is required to form minute-gap thin-film electrode pairs in correspondence with the pattern, and it is required to carry out patterning of the minute-gap thin-film electrode pairs instead of using a mask pattern, disadvantageously requiring extra cost by that much.

In the plasma etching apparatus of FIG. 33, only radicals among the particles existing in the generated plasma diffuse outwardly of a nozzle 114 separately from the plasma, and therefore, processing is to be carried out mainly by radicals in this kind of apparatus. The processing mainly using only radicals, which can also be applied to the processing of the entire surface of the object to be processed, cannot be applied to the processing of a part of the object to be processed. This is presumably because the radicals diffuse isotropically similarly to gas. Therefore, in order to apply this kind of apparatus to the process for forming a pattern by processing a minute region, it is required to use a mask pattern, and this leads to an issue that a process for forming a pattern by processing a minute region at low cost is difficult.

In view of the aforementioned conventional issues, the eighth through tenth embodiments of the present invention have the object of providing a plasma processing apparatus and method capable of forming a pattern by processing a minute region at low cost without using a mask pattern.

A plasma processing apparatus and method according to the eighth embodiment of the present invention will be described below with reference to FIGS. 27 through 29D.

Figure 27:
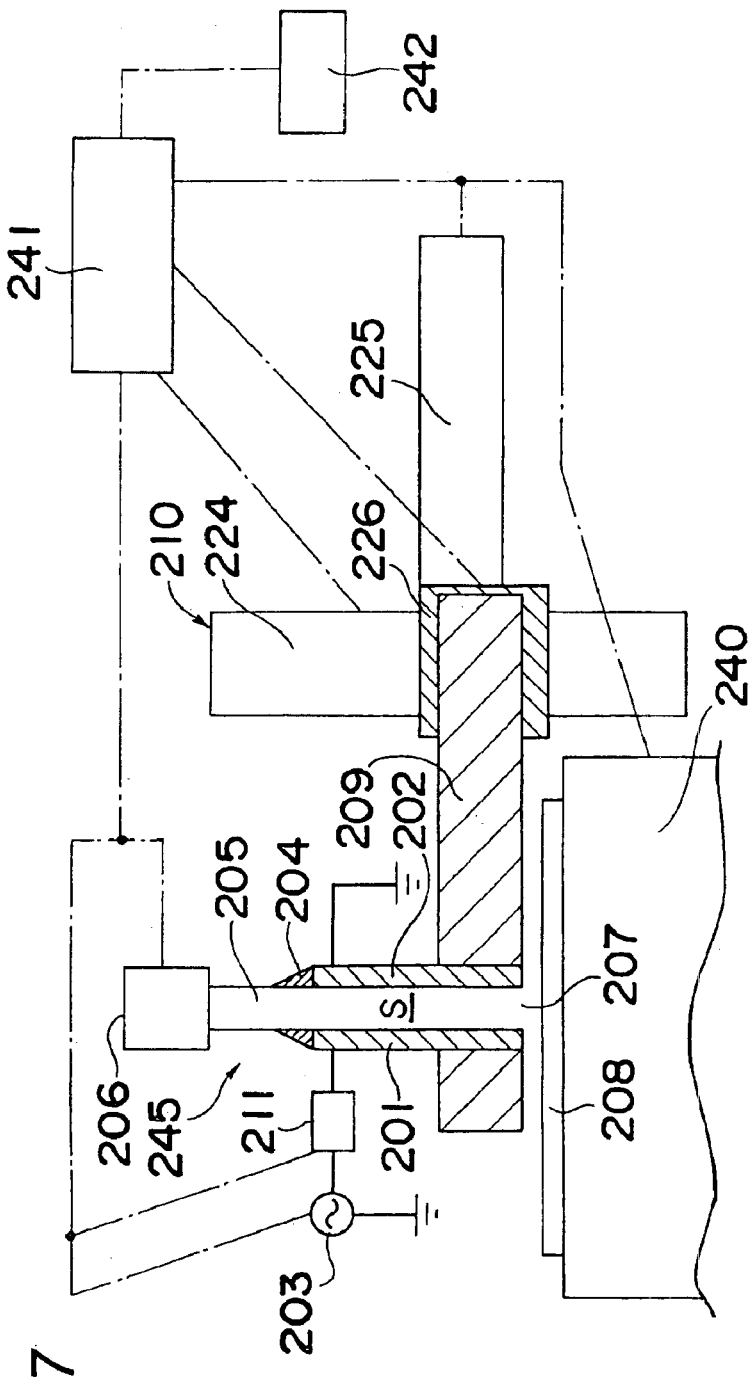
FIG. 27 is a schematic constituent view of a plasma processing apparatus of an eighth embodiment of the present invention.

Referring to FIG. 27, reference numeral 201 denotes a first electrode, and 202 denotes a second electrode, which are oppositely arranged so as to form a discharge space S for generating plasma discharge between the first electrode 201 and the second electrode 202, constituting a plasma generating section 245. By connecting a high-frequency power supply 203 to the first electrode 201, applying high-frequency power to the first electrode 201, and grounding the second electrode 202, plasma discharge is started in the discharge space S of the plasma generating section 245. A gas supply inlet 204 is provided at one end of the discharge space S located between the first electrode 201 and the second electrode 202 and connected to a gas supply unit 206 via a gas pipe 205, allowing gas to flow through the discharge space S. An opening 207 for carrying out plasma processing is provided at the other end of the discharge space S. By holding (or holding by suction) a substrate 208 as an object to be processed by means of a substrate holding stage 240 constructed of an X–Y stage provided with a suction function or the like as one example of an object moving unit adjacently to the opening 207, the substrate 208 is subjected to various plasma processing of etching, film formation, surface reforming, and so on.

The first electrode 201 and the second electrode 202, which constitute the plasma generating section 245, are both fixed to a stage 209. The stage 209 of the plasma generating section 245 is connected to a plasma generating section moving unit 210 that can perform three-dimensional position control, and the plasma generating section moving unit 210 is connected to a plasma processing control unit 241. The plasma processing control unit 241 is connected to a high-frequency power supply 203, a gas supply unit 206, a memory 242 that stores various sorts of plasma processing information of the substrate 208, and the substrate holding stage 240. On the basis of the various sorts of plasma processing information stored in the memory 242, application control of the high-frequency power to the first electrode 201 from the high-frequency power supply 203, gas supply control by the gas supply unit 206, and position control (further substrate position control by the substrate holding stage 240 at need) of the plasma generating section 245 by the plasma generating section moving unit 210 are carried out respectively. According to this operation, by moving the stage 209 while carrying out the plasma processing, the plasma processing can be performed automatically at an arbitrary plasma density throughout the specified region.

Figure 28:
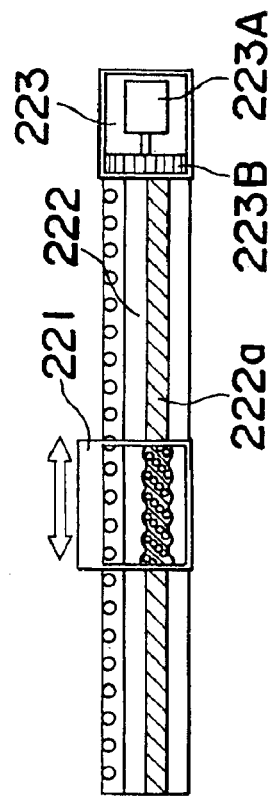
FIG. 28 is a schematic constituent view of a movement means in the eighth embodiment.

In this case, in order to drive the plasma generating section 245 while three-dimensionally controlling the same, the plasma generating section moving unit 210 is constructed of position control mechanisms 224, 225, and 226, each of which can perform one-dimensional position control. As shown in FIG. 28, these position control mechanisms 224, 225, and 226 are each constructed so that a stage 221 is movably supported by a rail guide 222 that has a bearing and meshed with a ball thread 222a arranged along the rail guide 222, and by forwardly and reversely driving the ball thread 222a by means of a drive unit 223 that has a reversibly driven servomotor 223A and a reduction gear 223B, the stage 221 advances and retreats. With this arrangement, the plasma generating section moving unit 210 can be driven respectively and independently in an X-axis direction (direction penetrating the sheet plane of FIG. 27), a Y-axis direction (lateral direction in FIG. 27) perpendicular to the X-axis direction, and a Z-axis direction (up-and-down direction in FIG. 27) perpendicular to the Y-axis direction. In this case, the plasma generating section moving unit 210 is constructed of an X-axis direction position control mechanism 226 that functions as an X-axis direction drive unit for advancing and retreating the stage 221 in the X-axis direction, a Y-axis direction position control mechanism 225 that functions as a Y-axis direction drive unit for advancing and retreating the stage 221 in the Y-axis direction, and a Z-axis direction position control mechanism 224 that functions as a Z-axis direction drive unit for advancing and retreating the stage 221 in the Z-axis direction. Then, by fixing the Y-axis direction position control mechanism 225 to the stage 221 of the Z-axis direction position control mechanism 224, fixing the X-axis direction position control mechanism 226 to the stage 221 of the Y-axis direction position control mechanism 225, and fixing the stage 209 to the stage 221 of the X-axis direction position control mechanism 226, the first electrode 201 and the second electrode 202 supported on the stage 209 can advance and retreat independently in the X-, Y-, and Z-axis directions, respectively, by the X-axis direction position control mechanism 226, the Y-axis direction position control mechanism 225, and the Z-axis direction position control mechanism 224.

A plasma intermissive generation control unit 211 is provided between the first electrode 201 and the high-frequency power supply 203, so that the region where plasma processing is carried out and the region where plasma processing is not carried out can be controlled when the stage 209 is moved. The plasma intermissive generation control unit 211 is connected to a plasma processing control unit 241 and executes operation so as to control the high-frequency power applied to the first electrode 201 from the high-frequency power supply 203 on the basis of, for example, the position information of the plasma generating section 245 from the X-axis direction position control mechanism 226, the Y-axis direction position control mechanism 225, and the Z-axis direction position control mechanism 224 and the position information of the region where plasma processing is carried out and the region where plasma processing is not carried out concerning the substrate 208 stored in the memory 242. As a result, plasma is generated by applying the high-frequency power from the high-frequency power supply 203 to the first electrode 201 only when the plasma generating section 245 is located above the region where the plasma processing of the substrate 208 is carried out, so that the plasma processing is carried out in the region where plasma processing is carried out. When the plasma generating section 245 is located above the region where plasma processing of the substrate 208 is not carried out, the high-frequency power is not applied from the high-frequency power supply 203 to the first electrode 201, so that the plasma processing is not carried out in the region where plasma processing is not carried out.

Figure 29A:
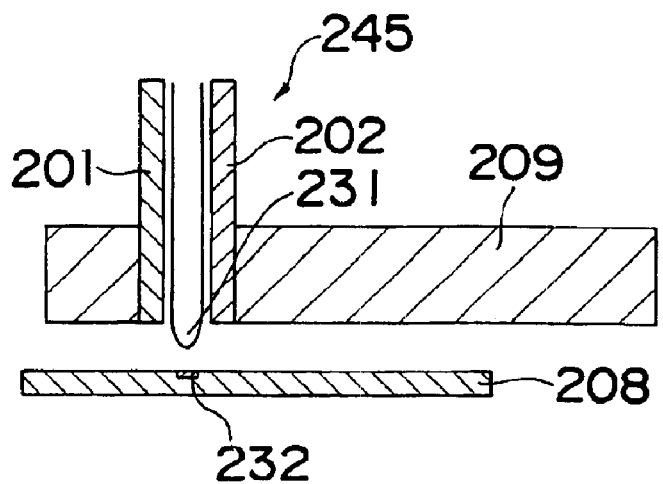
FIGS. 29A, 29B, 29C, and 29D are explanatory views of processing steps in the eighth embodiment.
Figure 29B:
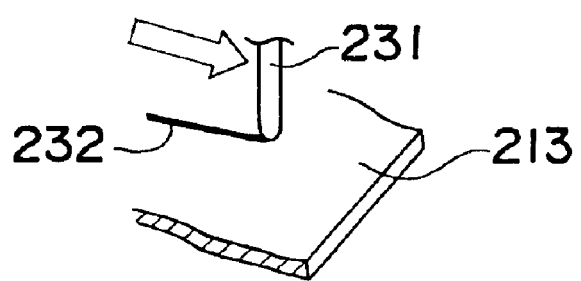
Figure 29C:
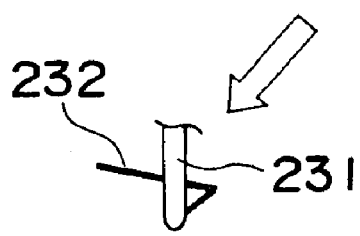
Figure 29D:
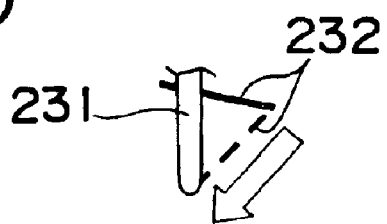

This will be described in detail with reference to FIGS. 29A through 29D. First of all, as shown in FIG. 29A, by generating plasma 231 in a discharge space S between the first electrode 201 and the second electrode 202 of the plasma generating section 245 and putting this plasma 231 close to the substrate 208, the plasma processing can be carried out on a plasma processing region 232 of the substrate 208. Next, as shown in FIG. 29B, by relativity moving the plasma 231 one-dimensionally or two-dimensionally to the substrate 208, the plasma processing area 232 can be a line. Moreover, as shown in FIG. 29C, by changing the direction of movement, plasma processing of the plasma processing region 232 can be achieved so that line connections in various directions (in other words, continuous linear portions) are formed. Further, as shown in FIG. 29D, by controlling the region where plasma processing is carried out and the region where plasma processing is not carried out by the plasma intermissive generation control unit 211, plasma processing of the plasma processing region 232 can be achieved so that discontinuous regions or, in other words, discontinuous linear portions are formed. Thus, according to the eighth embodiment, there can be achieved plasma processing for forming a pattern by processing a minute region at low cost without using a mask pattern.

Moreover, in the eighth embodiment, an appropriate voltage corresponding to a pressure and a gap between the electrodes is needed to start plasma discharge, and this is known as the Paschen's law. If the Paschen's law is applied to the eighth embodiment, then the product PD of a pressure P of the discharge space S and a thickness D of the discharge space S is provided. By applying a voltage of not lower than a minimum ignition voltage Vs corresponding to the product PD is applied across the opposed electrodes 201 and 202 by the plasma intermissive generation control unit 211, plasma discharge can be generated. If an excessively high voltage is applied across the opposed electrodes 201 and 202, then a shift to arc discharge occurs, possibly causing a concern about the damage of the electrode 201 or 202 or similar concern. Accordingly, in the eighth embodiment, the voltage applied across the opposed electrodes 201 and 202 has been set at 1 kV as an example for the sake of safety by the plasma intermissive generation control unit 211, and the ignition voltage has satisfied the voltage of not higher than 1 kV within a range of about 0.1 (Pa·m) to 120 (Pa·m) as the product PD with respect to air. Therefore, it is preferable to carry out the plasma processing under the control of the plasma intermissive generation control unit 211 on the condition that the product PD is 0.1 (Pa·m) to 120 (Pa·m).

Further, in the eighth embodiment, when the processing is carried out with high-frequency power of a frequency lower than 1 MHz, the damage of the electrodes 201 and 202 is significant, the processing cannot be achieved for a long time because the distance between the electrodes 201 and 202 changes. Conversely, the plasma discharge is not stable when the frequency exceeds 5 GHz, and therefore, the appropriate frequency of the high-frequency power supply 203 is 1 MHz to 5 GHz.

The ninth embodiment of the present invention will be described next with reference to FIG. 30. It is to be noted that the same components as those of the eighth embodiment are denoted by same reference numerals with no description provided therefor, and only the points of difference will be mainly described.

Figure 30:
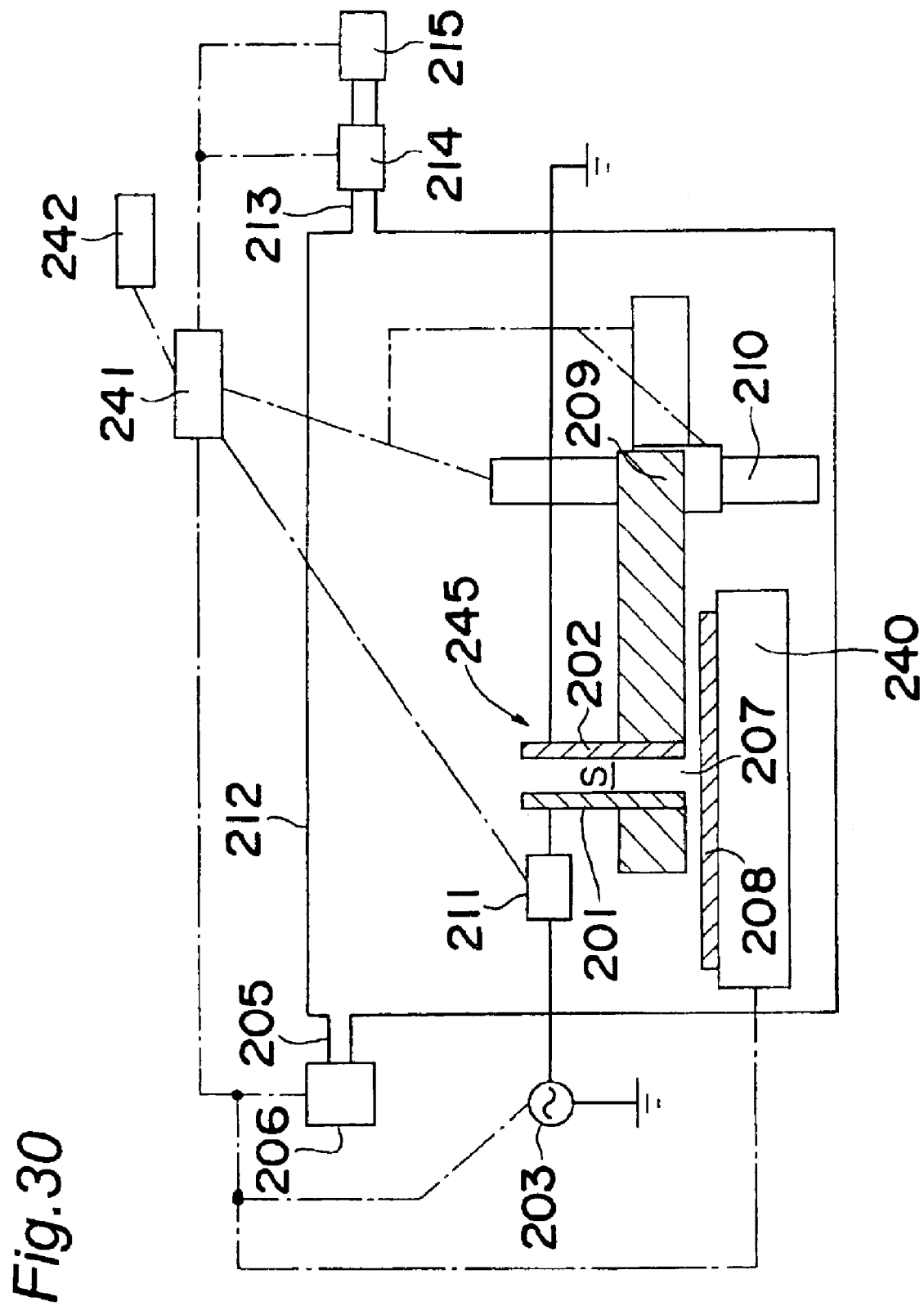
FIG. 30 is a schematic constituent view of a plasma processing apparatus of a ninth embodiment of the present invention.

Referring to FIG. 30, first and second electrodes 201 and 202, a stage 209, a plasma generating section moving unit 210, and a substrate holding stage 240 are arranged in a pressure-resistant container 212, which is a pressure-resistant chamber capable of maintaining the pressure at a reduced pressure or a high pressure. The pressure-resistant container 212 is connected to a gas supply unit 206 via a gas pipe 205, and the pressure-resistant container 212 is further connected to a vacuum pump 215 via a gas pipe 213 and a pressure control unit 214. Therefore, an arbitrary gas can be flowed through the whole interior of the pressure-resistant container 212 and, in particular, through the discharge space S between the first and second electrodes 201 and 202. Moreover, the interior can be controlled to an arbitrary pressure. Therefore, it is possible to carry out the processing while changing the gas type and pressure.

TABLE 1

| Pressure (kPa) | Etching Rate (nm/min) |
|---|---|
| 1 | 300 |
| 10 | 1000 |
| 100 | 2000 |

Table 1 shows the pressure dependence of etching rate when an interval between the electrodes 201 and 202 is set at 1 mm as one example, oxygen is used as a gas supplied from the gas supply unit 206, and an organic film is etched in the apparatus construction of FIG. 30. There is observed an increase in etching rate with an increase in pressure, and this makes it clear that the etching rate can be controlled by pressure control.

Moreover, in the ninth embodiment, there is the possibility of the occurrence of comparatively intense electromagnetic waves when the plasma processing-use pressure exceeds 200 kPa, or about double the atmospheric pressure, and therefore, it is required to carry out the processing at a pressure of not higher than 200 kPa in the apparatus construction of the ninth embodiment. Moreover, in the case of a pressure lower than 100 Pa, it is required to provide an expensive turbo-molecular pump or the like as a vacuum pump 215, and this consequently leads to high cost, meaning that it is not appropriate. Therefore, it is desirable to carry out the plasma processing at a pressure P of not lower than 100 Pa and not higher than 200 kPa under the control of the plasma intermissive generation control unit 211. Therefore, in the ninth embodiment, it is preferable to execute control so that the pressure of the discharge space is 100 Pa to 200 kPa and the product PD of the pressure P of the discharge space and the thickness D of the discharge space becomes 0.1 to 120 (Pam) under the control of the plasma intermissive generation control unit 211.

Further, in connection with the aforementioned ninth embodiment, there has been described only the case where oxygen is used as a gas that is supplied from the gas supply unit 206 and used for the plasma processing. However, the processing can easily be achieved so long as the gas is a reactive gas or, in particular, a gas including a halogen element, oxygen, nitrogen or the like or a rare gas that easily starts plasma discharge.

The tenth embodiment of the present invention will be described next with reference to FIG. 31. It is to be noted that the same components as those of the eighth embodiment are denoted by same reference numerals with no description provided therefor, and only the points of difference will be mainly described.

Figure 31:
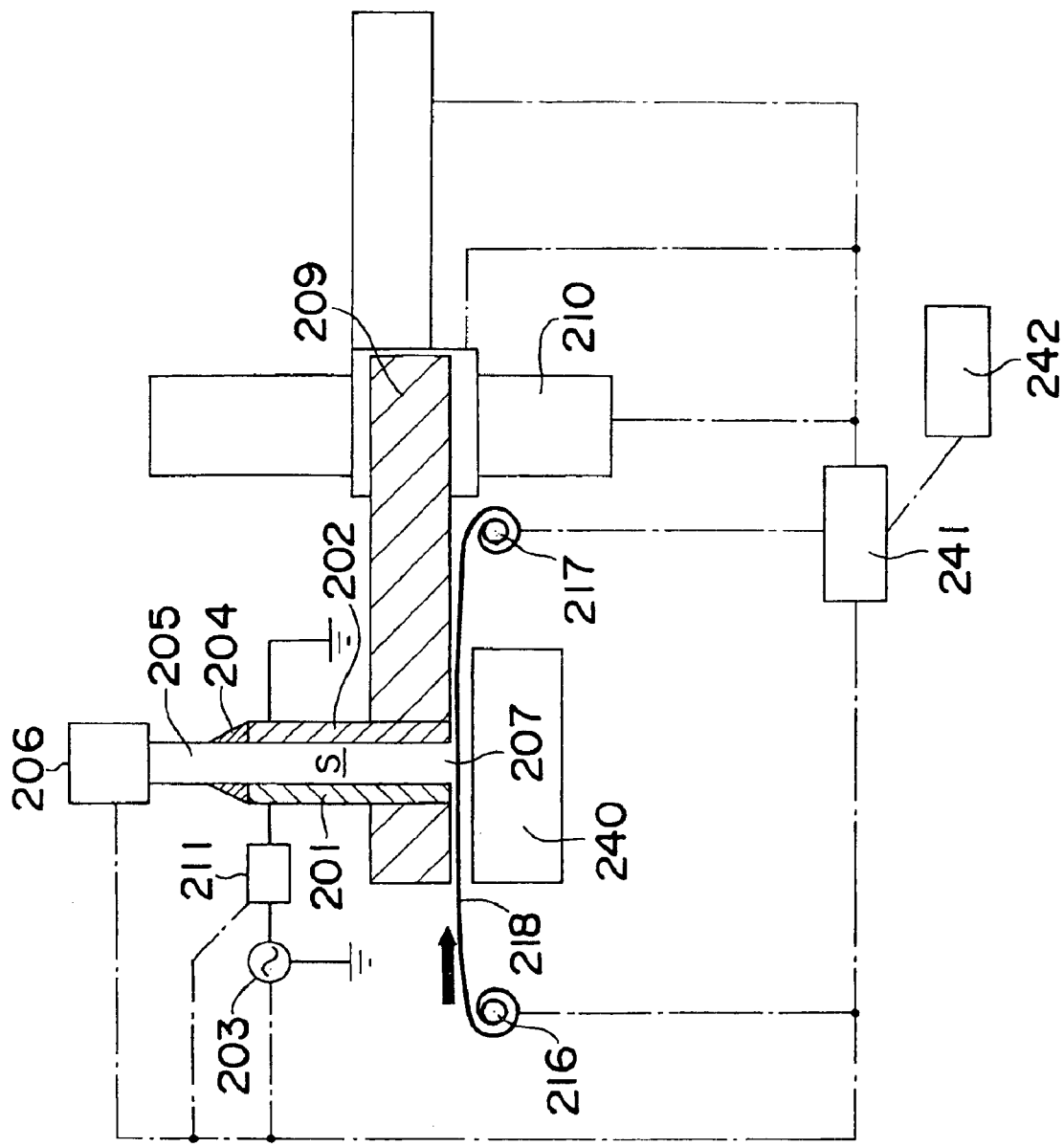
FIG. 31 is a schematic constituent view of a plasma processing apparatus of a tenth embodiment of the present invention.

Referring to FIG. 31, a film 218 is disposed adjacent to the opening 207 of the discharge space S located between the first and second electrodes 201 and 202 in place of the substrate 208 as an object to be processed, and this film 218 is subjected to a variety of plasma processes of etching, film formation, surface reforming, and the like. In particular, a pre-processing film driving roll 216 around which a pre-processing film 218 is wound and a post-processing film driving roll 217 for taking up the post-processing film 218 are provided, and the rolls are connected to a plasma processing control unit 241 and subjected to operation control.

The film 218 is drawn out and supplied from the pre-processing film driving roll 216 around which the pre-processing film 218 is wound, and the post-processing film 218 is taken up by the post-processing film driving roll 217 under the control of the plasma processing control unit 241.

In each of the aforementioned eighth to tenth embodiments, the embodiments have been described as being constructed so that the plasma generating section 245 for forming the discharge space S between the first and second electrodes 201 and 202 is moved by the stage 209 and the plasma generating section moving unit 210 capable of performing three-dimensional movement as examples. However, the plasma generating section moving unit 210 may be merely required to be a drive mechanism capable of executing three-dimensional position control. Without being limited to the mechanism described with reference to FIG. 28, there can be employed a system employing a dial gauge, a drive mechanism employing a piezoelectric element, and the like, appropriate for the accuracy of control and applications. Moreover, it is only required to relatively change the positions of the plasma generating section 245 and the object to be processed, and therefore, it is needless to say that a mechanism similar to the aforementioned one may be disposed on the object side. For example, the substrate holding stage 240 may be a substrate moving unit that is three-dimensionally controllable in position, allowing the substrate 208 to be three-dimensionally controllable in position. Otherwise, it is acceptable to make the plasma generating section 245 drivable in the up-and-down direction by the plasma generating section moving unit 210 and provide the substrate holding stage 240 as a substrate moving unit that is two-dimensionally controllable in position in the X- and Y-axes that are laterally perpendicular to each other.

Combinations of the first through seventh embodiments and the eighth through tenth embodiments of the present invention will be described next. As one example of a combination of the first embodiment and the eighth embodiment, a plasma processing apparatus for putting a plasma processing method according to the eleventh embodiment of the present invention into practice is first shown in FIG. 34.

Figure 34:
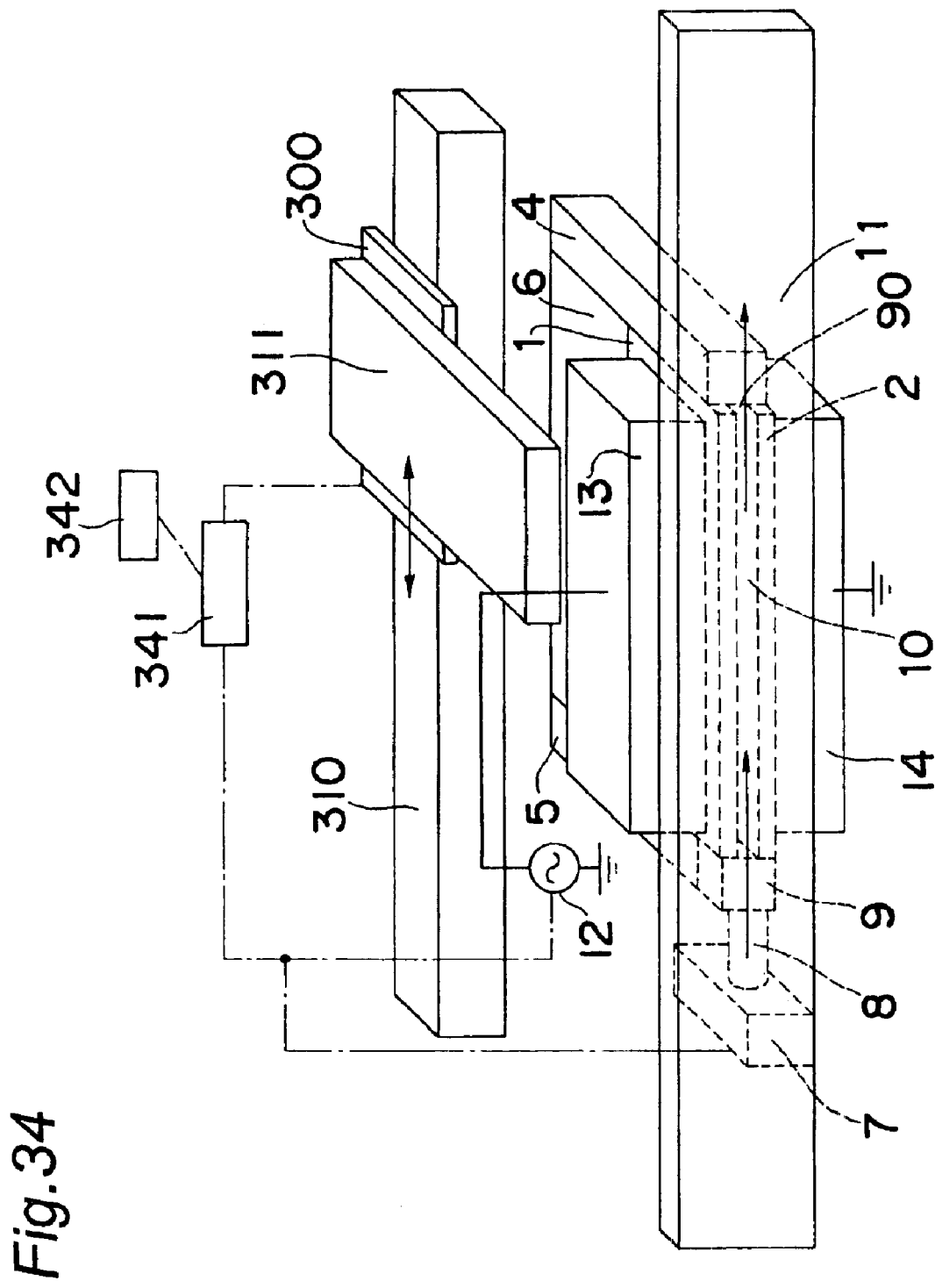
FIG. 34 is a partially see-through schematic constituent view of a plasma processing apparatus of an eleventh embodiment of the present invention.

Referring to FIG. 34, a movement stage 300, which functions as a plasma generating section moving unit, is arranged so as to be able to advance and retreat along a rail 310 arranged parallel to a substrate 11. As one example, the rail 310 and the movement stage 300 have a structure as shown in FIG. 28. That is, a stage 221 corresponding to the movement stage 300 is movably supported on a rail guide 222 that has bearings inside the rail 310 and meshed with a ball thread 222*a* arranged along the rail guide 222. By forwardly and reversely rotatively driving the ball thread 222*a* by a drive unit 223 that has a reversibly rotatable servomotor 223A and a reduction gear 223B, the stage 221 and also the movement stage 300 are made advance and retreat along the rail 310.

A plasma processing control unit 341 is connected to the servomotor 223A, a high-frequency power supply 12, a gas supply unit 7, and a memory 342 that stores various sorts of plasma processing information of the substrate 11 (if a substrate holding stage similar to the substrate holding stage 240 is arranged at need, the unit is also connected to the substrate holding stage). On the basis of the various sorts of plasma processing information stored in the memory 342, application control of high-frequency power from the high-frequency power supply 12 to the electrode 13, and gas supply control by the gas supply unit 7, and position control of the microplasma generating-use space 3 by the plasma generating section movement stage 300 (and further substrate position control by the substrate holding stage at need) are executed respectively. According to this operation, by moving the microplasma generating-use space 3 while carrying out plasma processing, the plasma processing can be carried out automatically at an arbitrary plasma density throughout the desired region.

Figure 35:
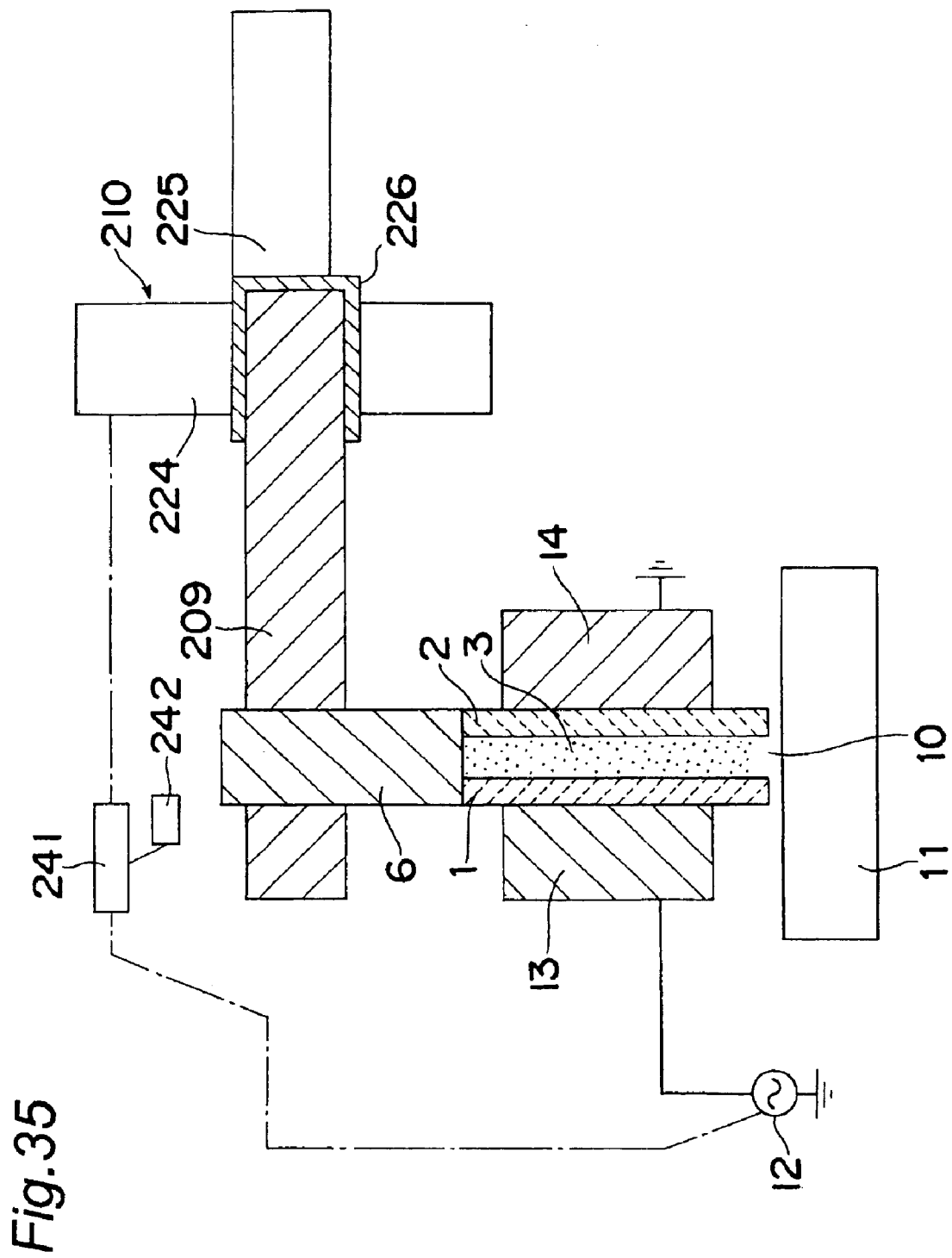
FIG. 35 is a schematic constituent view of a plasma processing apparatus of a twelfth embodiment of the present invention.

As another example, FIG. 35 shows a plasma processing apparatus for putting a plasma processing method according to the twelfth embodiment of the present invention into practice.

Referring to FIG. 35, by supporting the microplasma source of FIG. 1 on the stage 209 instead of the plasma generating section 245 of the plasma processing apparatus of FIG. 27, the microplasma source of FIG. 1 is able to advance and retreat independently in the directions of X, Y, and Z axes by the driving of the plasma generating section moving unit 210.

Moreover, it is acceptable to apply the plasma processing conditions of the eighth through tenth embodiments to the first through seventh embodiments of the present invention. That is, for example, by providing the plasma processing apparatus of the first embodiment further with a plasma processing control unit 341 as shown in FIG. 34 or with a plasma processing control unit 241 as shown in FIG. 35, there is executable control so that the pressure of the space 3 of the microplasma source becomes 100 Pa to 200 kPa and the product PD of the pressure P of the space 3 of the microplasma source and the thickness D of the space 3 of the microplasma source becomes 0.1 to 120 (Pa·m). Furthermore, as described hereinabove, the space 3 of the microplasma source and the substrate 11 can be moved relatively to each other by the plasma generating section moving unit 210 or 300.

Therefore, when the fine linear portion 15 is formed on the substrate 11, there is executed control so that the pressure of the space 3 of the microplasma source is maintained at 100 Pa to 200 kPa and the product PD of the pressure P of the space 3 of the microplasma source and the thickness D of the space 3 of the microplasma source becomes 0.1 to 120 (Pa·m). By supplying electric power to the member located in the vicinity of the space 3 of the microplasma source or, for example, the electrode 25, plasma is generated in the space 3 of the microplasma source. Subsequently, the fine linear portion 15 may be formed on the substrate 11 by the plasma generated as above by moving the generated plasma and the substrate 11 relatively to each other.

As described above, according to the combinations of the first through seventh embodiments and the eighth through tenth embodiments of the present invention, the effects provided by the embodiments combined in various ways can be collectively produced, and the pattern forming-use plasma processing can be put into practice by processing the minute region at lower cost more efficiently and more accurately also without using a mask pattern.

According to the plasma processing apparatus and method of the present invention, by arranging the first and second electrodes opposite to each other to form the discharge space between both the electrodes, supplying the gas to the discharge space, executing control so that the pressure of the discharge space is maintained at 100 Pa to 200 kPa and the product PD of the pressure P of the discharge space and the thickness D of the discharge space becomes 0.1 to 120 (Pa·m), applying the high-frequency power to the first electrode to generate plasma in the discharge space, moving the generated plasma and the object to be processed relatively to each other, and processing the object to be processed with the generated plasma, an arbitrary pattern can be processed without using a mask pattern by moving the plasma generating section and the object to be processed relatively to each other while processing the minute region facing the discharge space with the plasma generated by supplying the gas to the discharge space located between the electrodes. Moreover, by limiting the pressure of the discharge space and the relation between the pressure and the thickness of the discharge space as described hereinabove, plasma processing can be carried out at low cost without using an expensive evacuation means nor generating intense electromagnetic waves. Moreover, plasma processing can be started by discharge ignition without making the application voltage extremely high.

Moreover, it is suitable for the processing of the minute gap to supply the gas from one end of the discharge space and process the object to be processed disposed oppositely to the opening at the other end of the discharge space.

Moreover, if the processing is carried out with the plasma generated intermittently, then a discontinuous pattern can be arbitrarily formed.

Moreover, it is suitable for processing a film-shaped object to be processed to provide the moving unit of the object to be processed by a roll for winding up the film-shaped object to be processed.

Moreover, the gas can be provided by a reactive gas having reactivity according to processing or, in particular, gas including at least one of a halogen element, oxygen, and nitrogen, and the plasma discharge can easily be started when a rare gas is used.

Moreover, it is preferable to use high-frequency power having a frequency of 1 MHz to 5 GHz in enabling the restraint of the wearing of the electrodes and the stabilization of plasma discharge.

By properly combining arbitrary embodiments out of the aforementioned various embodiments, the effects owned by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method for forming a fine linear portion on an object to be processed, said method comprising:
    generating microplasma in a space of a microplasma source arranged in a vicinity of the object while supplying gas to the space of the microplasma sources;
    supplying electric power to a member located in the vicinity of the space of the microplasma;
    making activated particles discharged from an opening of the microplasma source connected to the space act on the object; and
    forming the fine linear portion on the object while flowing the gas to a neighborhood of the opening parallel to the object along a lengthwise direction of the fine linear portion.

2. The plasma processing method as claimed in claim 1, wherein the member located in the vicinity of the space of the microplasma source, is at least one of an electrode provided on a side opposite from a surface to be processed of the object, the object, and the microplasma source.

3. The plasma processing method as claimed in claim 1, wherein the fine linear portion is formed on the object while flowing the gas to the neighborhood of the opening parallel to the object along the lengthwise direction of the fine linear portion in a state in which a cross-sectional area obtained by cutting the space for generating the microplasma by a plane perpendicular to the lengthwise direction of the fine linear portion is larger than a cross-sectional area obtained by cutting a rectangular parallelepiped that has the opening of the microplasma source and the fine linear portion of the object as opposite surfaces by a plane perpendicular to the lengthwise direction of the fine linear portion.

4. The plasma processing method as claimed in claim 1, wherein the fine linear portion is formed on the object while flowing the gas to the neighborhood of the opening parallel to the object along the lengthwise direction of the fine linear portion in a state in which a cross-sectional area obtained by cutting the space for generating the microplasma by a plane perpendicular to the lengthwise direction of the fine linear portion is ten or more times larger than a cross-sectional area obtained by cutting a rectangular parallelepiped that has the opening of the microplasma source and the fine linear portion of the object as opposite surfaces by a plane perpendicular to the lengthwise direction of the fine linear portion.

5. The plasma processing method as claimed in claim 1, wherein the fine linear portion is formed on the object while flowing the gas through a gas flow passage provided parallel to the object along the lengthwise direction of the fine linear portion and carrying out gas supply to the gas flow passage and gas exhaustion from the gas flow passage in a space separated from a space brought in contact with the object.

6. The plasma processing method as claimed in claim 1, wherein the opening of the microplasma source has a width of not smaller than 0.01 mm and not greater than 5 mm.

7. The plasma processing method as claimed in claim 1, wherein the opening of the microplasma source has a width of not smaller than 0.01 mm and not greater than 1 mm.

8. The plasma processing method as claimed in claim 1, wherein a distance between the opening of the microplasma source and the object is not smaller than 0.01 mm and not greater than 1 mm.

9. The plasma processing method as claimed in claim 1, wherein a distance between the opening of the microplasma source and the object is not smaller than 0.01 mm and not greater than 0.5 mm.

10. The plasma processing method as claimed in claim 1, wherein the space of the microplasma source has a gas supply inlet to which the gas is supplied and a gas exhaust outlet which is provided separately from the opening of the microplasma source and from which the gas supplied to the space is exhausted.

11. The plasma processing method as claimed in claim 10, wherein the fine linear portion is formed on the object while the gas supplied from the gas supply inlet is exhausted by 70% or more in terms of a supply flow rate from the gas exhaust outlet.

12. The plasma processing method as claimed in claim 1, wherein the fine linear portion is formed on the object while flowing the gas through a gas flow passage provided parallel to the object along the lengthwise direction of the fine linear portion and discharging the activated particles from the opening which is narrower than the gas flow passage.

13. The plasma processing method as claimed in claim 12, wherein the fine linear portion is formed on the object while flowing the gas to the neighborhood of the opening parallel to the object along the lengthwise direction of the fine linear portion in a space where a cross-sectional area obtained by cutting the gas flow passage by a plane perpendicular to the lengthwise direction of the fine linear portion is larger than a cross-sectional area obtained by cutting a rectangular parallelepiped that has the opening of the microplasma source and the fine linear portion of the object as opposite surfaces by a plane perpendicular to the lengthwise direction of the fine linear portion.

14. The plasma processing method as claimed in claim 12, wherein the fine linear portion is formed on the object while flowing the gas to the neighborhood of the opening parallel to the object along the lengthwise direction of the fine linear portion in a space where a cross-sectional area obtained by cutting the gas flow passage by a plane perpendicular to the lengthwise direction of the fine linear portion is ten or more times larger than a cross-sectional area obtained by cutting a rectangular parallelepiped that has the opening of the microplasma source and the fine linear portion of the object as opposite surfaces by a plane perpendicular to the lengthwise direction of the fine linear portion.

15. A plasma processing method for forming a fine linear portion on an object to be processed, said method comprising:
   generating microplasma in a space of a microplasma source arranged in a vicinity of the object while supplying gas to the microplasma source;
   supplying electric power to at least one of an electrode provided on a side opposite from a surface to be processed of the object, the object, and the microplasma source, and by making activated particles discharged from an opening of the microplasma source connected to the space act on the object; and
   forming the fine linear portion on the object while flowing the gas to a neighborhood of the opening parallel to the object along a lengthwise direction of the fine linear portion by carrying out gas supply to the space for generating the microplasma via a through hole provided at a wall surface that surrounds the space for generating the microplasma; and
   carrying out gas exhaustion from the space for generating the microplasma via the space for generating the microplasma toward a side opposite from a side on which the fine linear portion of the object is disposed.

* * * * *